United States Patent
Sandhu et al.

(10) Patent No.: US 9,991,441 B2
(45) Date of Patent: Jun. 5, 2018

(54) SEMICONDUCTOR STRUCTURES AND DEVICES AND METHODS OF FORMING SEMICONDUCTOR STRUCTURES AND MAGNETIC MEMORY CELLS

(71) Applicant: Micron Technology, Inc., Boise, ID (US)

(72) Inventors: Gurtej S. Sandhu, Boise, ID (US); Sumeet C. Pandey, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days. days.

(21) Appl. No.: 15/057,909

(22) Filed: Mar. 1, 2016

(65) Prior Publication Data

US 2016/0181513 A1    Jun. 23, 2016

Related U.S. Application Data

(62) Division of application No. 14/249,183, filed on Apr. 9, 2014, now Pat. No. 9,281,466.

(51) Int. Cl.
    *H01L 43/08*    (2006.01)
    *H01L 43/02*    (2006.01)
    (Continued)

(52) U.S. Cl.
    CPC ........... *H01L 43/08* (2013.01); *H01L 27/222* (2013.01); *H01L 43/02* (2013.01); *H01L 43/10* (2013.01); *H01L 43/12* (2013.01)

(58) Field of Classification Search
    CPC ...... G01R 33/098; H01L 43/10; G11B 5/3909
    See application file for complete search history.

(56) References Cited

U.S. PATENT DOCUMENTS

| 4,882,936 A | 11/1989 | Garshelis |
| 5,551,586 A | 9/1996 | Uenoyama et al. |

(Continued)

FOREIGN PATENT DOCUMENTS

| CN | 101162756 A | 4/2008 |
| CN | 101395732 A | 3/2009 |

(Continued)

OTHER PUBLICATIONS

"Knovel Sampler," Knovel, (2003), http://app.knovel.com/web/view/html/show.v/rcid:kpKS000009/cid:kt003BCMZ2/viewerType:html/root_slug:front-matte/url_slug:front-matter?b-q=ioniz . . . ; 2 pages.

(Continued)

*Primary Examiner* — Moazzam Hossain
*Assistant Examiner* — Farun Lu
(74) *Attorney, Agent, or Firm* — TraskBritt

(57) ABSTRACT

A magnetic cell includes a magnetic region formed from a precursor magnetic material comprising a diffusive species and at least one other species. An amorphous region is proximate to the magnetic region and is formed from a precursor trap material comprising at least one attracter species having at least one trap site and a chemical affinity for the diffusive species. The diffusive species is transferred from the precursor magnetic material to the precursor trap material where it bonds to the at least one attracter species at the trap sites. The species of the enriched trap material may intermix such that the enriched trap material becomes or stays amorphous. The depleted magnetic material may then be crystallized through propagation from a neighboring crystalline material without interference from the amorphous, enriched trap material. This enables high tunnel magnetoresistance and high magnetic anisotropy strength.

(Continued)

Methods of fabrication and semiconductor devices are also disclosed.

19 Claims, 14 Drawing Sheets

(51) Int. Cl.
H01L 43/10 (2006.01)
H01L 43/12 (2006.01)
H01L 27/22 (2006.01)

(56) References Cited

U.S. PATENT DOCUMENTS

| | | | |
|---|---|---|---|
| 5,563,000 A | 10/1996 | Hatwar et al. |
| 5,565,266 A | 10/1996 | Hatwar et al. |
| 5,583,725 A | 12/1996 | Coffey et al. |
| 5,604,030 A | 2/1997 | Yamane et al. |
| 5,768,069 A | 6/1998 | Mauri |
| 6,166,948 A | 12/2000 | Parkin et al. |
| 6,258,470 B1 | 7/2001 | Sakakima et al. |
| 6,275,363 B1 | 8/2001 | Gill |
| 6,347,049 B1 | 2/2002 | Childress et al. |
| 6,363,000 B2 | 3/2002 | Perner et al. |
| 6,387,476 B1 | 5/2002 | Iwasaki et al. |
| 6,483,741 B1 | 11/2002 | Iwasaki et al. |
| 6,560,135 B2 | 5/2003 | Matsuoka et al. |
| 6,569,545 B1 | 5/2003 | Kanbe et al. |
| 6,611,405 B1 | 8/2003 | Inomata et al. |
| 6,653,704 B1 | 11/2003 | Gurney et al. |
| 6,703,249 B2 | 3/2004 | Okazawa et al. |
| 6,771,534 B2 | 8/2004 | Stipe |
| 6,806,096 B1 | 10/2004 | Kim et al. |
| 6,845,038 B1 | 1/2005 | Shukh |
| 6,955,857 B2 | 10/2005 | Kubota et al. |
| 6,964,819 B1 | 11/2005 | Girt et al. |
| 6,970,376 B1 | 11/2005 | Fukuzumi |
| 6,980,468 B1 | 12/2005 | Ounadjela |
| 6,992,359 B2 | 1/2006 | Nguyen et al. |
| 6,998,150 B2 | 2/2006 | Li et al. |
| 7,026,671 B2 | 4/2006 | Mizuguchi et al. |
| 7,095,933 B2 | 8/2006 | Barth |
| 7,130,167 B2 | 10/2006 | Gill |
| 7,189,583 B2 | 3/2007 | Drewes |
| 7,230,265 B2 | 6/2007 | Kaiser et al. |
| 7,239,489 B2 | 7/2007 | Lin et al. |
| 7,274,080 B1 | 9/2007 | Parkin |
| 7,372,674 B2 | 5/2008 | Gill |
| 7,378,698 B2 | 5/2008 | Ha et al. |
| 7,379,280 B2 | 5/2008 | Fukumoto et al. |
| 7,486,552 B2 | 2/2009 | Apalkov et al. |
| 7,488,609 B1 | 2/2009 | Lin et al. |
| 7,514,160 B2 | 4/2009 | Nagahama et al. |
| 7,563,486 B2 | 7/2009 | Barth |
| 7,564,152 B1 | 7/2009 | Clark et al. |
| 7,602,033 B2 | 10/2009 | Zhao |
| 7,660,153 B2 | 2/2010 | Yamane et al. |
| 7,682,841 B2 | 3/2010 | Dahmani et al. |
| 7,732,881 B2 | 6/2010 | Wang |
| 7,750,421 B2 | 7/2010 | Horng et al. |
| 7,791,844 B2 | 9/2010 | Carey et al. |
| 7,835,173 B2 | 11/2010 | Ma et al. |
| 7,863,060 B2 | 1/2011 | Belen et al. |
| 7,885,105 B2 | 2/2011 | Li et al. |
| 7,919,794 B2 | 4/2011 | Gu et al. |
| 7,929,370 B2 | 4/2011 | Min |
| 7,932,572 B2 | 4/2011 | Tsujiuchi |
| 7,948,044 B2 | 5/2011 | Horng et al. |
| 8,009,465 B2 | 8/2011 | Nakayama et al. |
| 8,043,732 B2 | 10/2011 | Anderson et al. |
| 8,048,492 B2 | 11/2011 | Fukuzawa et al. |
| 8,068,317 B2 | 11/2011 | Gill |
| 8,080,432 B2 | 12/2011 | Horng et al. |
| 8,089,137 B2 | 1/2012 | Lung et al. |
| 8,102,700 B2 | 1/2012 | Liu et al. |
| 8,120,949 B2 | 2/2012 | Ranjan et al. |
| 8,138,561 B2 | 3/2012 | Horng et al. |
| 8,223,539 B2 | 7/2012 | Smythe et al. |
| 8,324,697 B2 | 12/2012 | Worledge |
| 8,334,148 B2 | 12/2012 | Jeong et al. |
| 8,338,004 B2 | 12/2012 | Shin et al. |
| 8,357,962 B2 | 1/2013 | Marukame et al. |
| 8,385,107 B2 | 2/2013 | Prejbeanu |
| 8,411,498 B2 | 4/2013 | Kim et al. |
| 8,422,286 B2 | 4/2013 | Ranjan et al. |
| 8,470,462 B2 | 6/2013 | Horng et al. |
| 8,487,390 B2 | 7/2013 | Dimitrov et al. |
| 8,492,169 B2 | 7/2013 | Cao et al. |
| 8,514,527 B2 | 8/2013 | Komagaki et al. |
| 8,570,798 B2 | 10/2013 | Meade et al. |
| 8,587,043 B2 | 11/2013 | Natori et al. |
| 8,604,573 B2 | 12/2013 | Yamakawa et al. |
| 8,623,452 B2 | 1/2014 | Zhou |
| 8,692,342 B2 | 4/2014 | Oh et al. |
| 8,704,320 B2 | 4/2014 | Zhu et al. |
| 8,749,003 B2 | 6/2014 | Horng et al. |
| 8,766,341 B2 | 7/2014 | Han et al. |
| 8,779,538 B2 | 7/2014 | Chen et al. |
| 8,790,798 B2 | 7/2014 | Shukh |
| 8,803,265 B2 | 8/2014 | Lim et al. |
| 8,812,803 B2 | 8/2014 | Tsuchiya et al. |
| 8,823,118 B2 | 9/2014 | Horng et al. |
| 8,923,038 B2 | 12/2014 | Kula et al. |
| 9,373,780 B2 | 6/2016 | Jan et al. |
| 9,466,789 B2 | 10/2016 | Wang et al. |
| 9,472,752 B2 | 10/2016 | Wang et al. |
| 9,705,075 B2 | 7/2017 | Lim et al. |
| 2001/0024853 A1 | 9/2001 | Wallace et al. |
| 2002/0089874 A1 | 7/2002 | Nickel et al. |
| 2002/0097534 A1 | 7/2002 | Sun et al. |
| 2002/0105827 A1 | 8/2002 | Redon et al. |
| 2002/0114112 A1 | 8/2002 | Nakashio et al. |
| 2003/0011939 A1 | 1/2003 | Gill |
| 2003/0030434 A1 | 2/2003 | Hasegawa et al. |
| 2003/0035255 A1 | 2/2003 | Hasegawa et al. |
| 2003/0063415 A1 | 4/2003 | Hasegawa et al. |
| 2003/0064569 A1 | 4/2003 | Takayama et al. |
| 2003/0103371 A1 | 6/2003 | Kim et al. |
| 2003/0199104 A1 | 10/2003 | Leuschner et al. |
| 2004/0008455 A1 | 1/2004 | Hasegawa et al. |
| 2004/0075959 A1 | 4/2004 | Gill |
| 2004/0091744 A1 | 5/2004 | Carey et al. |
| 2004/0144995 A1 | 7/2004 | Nagahama et al. |
| 2004/0174740 A1 | 9/2004 | Lee et al. |
| 2004/0224243 A1 | 11/2004 | Yoshizawa et al. |
| 2004/0233760 A1 | 11/2004 | Guo et al. |
| 2004/0246776 A1 | 12/2004 | Covington |
| 2005/0019608 A1 | 1/2005 | Kim et al. |
| 2005/0024786 A1 | 2/2005 | Gill et al. |
| 2005/0036361 A1 | 2/2005 | Fukuzumi |
| 2005/0068683 A1 | 3/2005 | Gill |
| 2005/0087511 A1 | 4/2005 | Sharma et al. |
| 2005/0106810 A1 | 5/2005 | Pakala et al. |
| 2005/0164414 A1 | 7/2005 | Deak |
| 2005/0173698 A1 | 8/2005 | Drewes |
| 2005/0189574 A1 | 9/2005 | Nguyen et al. |
| 2005/0211973 A1 | 9/2005 | Mori et al. |
| 2005/0230743 A1 | 10/2005 | Nakagawa et al. |
| 2005/0231853 A1 | 10/2005 | Li et al. |
| 2005/0233174 A1 | 10/2005 | Munteanu et al. |
| 2005/0276099 A1 | 12/2005 | Horng et al. |
| 2006/0002039 A1 | 1/2006 | Hasegawa et al. |
| 2006/0038213 A1 | 2/2006 | Mori et al. |
| 2006/0042930 A1 | 3/2006 | Mauri |
| 2006/0098354 A1 | 5/2006 | Parkin |
| 2006/0114714 A1 | 6/2006 | Kanegae |
| 2006/0118842 A1 | 6/2006 | Iwata |
| 2006/0261425 A1 | 11/2006 | Suemitsu et al. |
| 2007/0008661 A1 | 1/2007 | Min et al. |
| 2007/0026260 A1 | 2/2007 | Nemoto et al. |
| 2007/0026263 A1 | 2/2007 | Kubota et al. |
| 2007/0035890 A1 | 2/2007 | Sbiaa |
| 2007/0053112 A1 | 3/2007 | Papworth Parkin |
| 2007/0086121 A1 | 4/2007 | Nagase et al. |

(56) References Cited

U.S. PATENT DOCUMENTS

| | | |
|---|---|---|
| 2007/0132003 A1 | 6/2007 | Takashima et al. |
| 2007/0201265 A1 | 8/2007 | Ranjan et al. |
| 2007/0217071 A1 | 9/2007 | Inamura et al. |
| 2007/0247756 A1 | 10/2007 | Lai et al. |
| 2007/0253116 A1* | 11/2007 | Takahashi ............ B82Y 25/00 360/313 |
| 2007/0279977 A1 | 12/2007 | Banerjee et al. |
| 2007/0297220 A1 | 12/2007 | Yoshikawa et al. |
| 2008/0164502 A1 | 7/2008 | Fukumoto et al. |
| 2008/0164548 A1 | 7/2008 | Ranjan et al. |
| 2008/0170329 A1 | 7/2008 | Thangaraj et al. |
| 2008/0179699 A1 | 7/2008 | Horng et al. |
| 2008/0182131 A1 | 7/2008 | Iwasaki |
| 2008/0198512 A1 | 8/2008 | Mukai |
| 2008/0205130 A1 | 8/2008 | Sun et al. |
| 2008/0225581 A1 | 9/2008 | Yamane et al. |
| 2008/0242088 A1 | 10/2008 | Suzuki |
| 2008/0253039 A1 | 10/2008 | Nagamine et al. |
| 2008/0278867 A1 | 11/2008 | Fukumoto et al. |
| 2009/0039450 A1 | 2/2009 | Lee et al. |
| 2009/0079018 A1 | 3/2009 | Nagase et al. |
| 2009/0096043 A1 | 4/2009 | Min et al. |
| 2009/0108383 A1 | 4/2009 | Horng et al. |
| 2009/0168238 A1 | 7/2009 | Kim et al. |
| 2009/0180215 A1 | 7/2009 | Ishikawa et al. |
| 2009/0190262 A1 | 7/2009 | Murakami et al. |
| 2009/0195924 A1 | 8/2009 | Nemoto et al. |
| 2009/0218645 A1 | 9/2009 | Ranjan et al. |
| 2009/0229111 A1 | 9/2009 | Zhao et al. |
| 2009/0231909 A1 | 9/2009 | Dieny et al. |
| 2009/0250776 A1 | 10/2009 | Takenaga et al. |
| 2009/0251829 A1 | 10/2009 | Zhang et al. |
| 2009/0257151 A1 | 10/2009 | Zhang et al. |
| 2010/0034014 A1 | 2/2010 | Ohno et al. |
| 2010/0035085 A1 | 2/2010 | Jung et al. |
| 2010/0080036 A1 | 4/2010 | Liu et al. |
| 2010/0080048 A1 | 4/2010 | Liu et al. |
| 2010/0086809 A1 | 4/2010 | Kuboki |
| 2010/0096716 A1 | 4/2010 | Ranjan et al. |
| 2010/0102406 A1 | 4/2010 | Xi et al. |
| 2010/0109110 A1 | 5/2010 | Wang et al. |
| 2010/0110783 A1 | 5/2010 | Liu et al. |
| 2010/0140726 A1 | 6/2010 | Apalkov et al. |
| 2010/0148167 A1 | 6/2010 | Whig et al. |
| 2010/0171086 A1 | 7/2010 | Lung et al. |
| 2010/0176472 A1 | 7/2010 | Shoji |
| 2010/0177557 A1 | 7/2010 | Liu et al. |
| 2010/0177561 A1 | 7/2010 | Liu et al. |
| 2010/0200899 A1 | 8/2010 | Marukame et al. |
| 2010/0219491 A1 | 9/2010 | Lee et al. |
| 2010/0220516 A1 | 9/2010 | Lee et al. |
| 2010/0230769 A1 | 9/2010 | Ozaki et al. |
| 2010/0240151 A1 | 9/2010 | Belen et al. |
| 2010/0276771 A1 | 11/2010 | Fukumoto et al. |
| 2010/0327248 A1 | 12/2010 | Khoueir et al. |
| 2011/0007429 A1 | 1/2011 | Dimitrov et al. |
| 2011/0007543 A1 | 1/2011 | Khoury |
| 2011/0014500 A1 | 1/2011 | Horng et al. |
| 2011/0031569 A1 | 2/2011 | Watts et al. |
| 2011/0049657 A1 | 3/2011 | Tsukamoto et al. |
| 2011/0049658 A1 | 3/2011 | Zheng et al. |
| 2011/0051503 A1 | 3/2011 | Hu et al. |
| 2011/0062537 A1 | 3/2011 | Oh et al. |
| 2011/0064969 A1 | 3/2011 | Chen et al. |
| 2011/0086439 A1 | 4/2011 | Choi |
| 2011/0096443 A1 | 4/2011 | Zhang et al. |
| 2011/0121366 A1 | 5/2011 | Or-Bach et al. |
| 2011/0134563 A1 | 6/2011 | Komagaki et al. |
| 2011/0145514 A1 | 6/2011 | Lee et al. |
| 2011/0149646 A1 | 6/2011 | Liu et al. |
| 2011/0149647 A1 | 6/2011 | Kim et al. |
| 2011/0149670 A1 | 6/2011 | Heo et al. |
| 2011/0151280 A1 | 6/2011 | Takahashi et al. |
| 2011/0170339 A1 | 7/2011 | Wunderlich et al. |
| 2011/0170341 A1 | 7/2011 | Butler |
| 2011/0194329 A1 | 8/2011 | Ohba et al. |
| 2011/0241138 A1 | 10/2011 | Hsieh et al. |
| 2011/0260274 A1 | 10/2011 | Zheng et al. |
| 2011/0266642 A1 | 11/2011 | Viala et al. |
| 2011/0269251 A1 | 11/2011 | Kim et al. |
| 2011/0293967 A1 | 12/2011 | Zhang et al. |
| 2011/0298456 A1 | 12/2011 | Lu et al. |
| 2011/0303995 A1 | 12/2011 | Worledge |
| 2011/0303997 A1 | 12/2011 | Wang et al. |
| 2011/0309418 A1 | 12/2011 | Nakayama et al. |
| 2012/0012952 A1 | 1/2012 | Chen et al. |
| 2012/0012953 A1 | 1/2012 | Lottis et al. |
| 2012/0012954 A1 | 1/2012 | Yamada et al. |
| 2012/0015099 A1 | 1/2012 | Sun et al. |
| 2012/0018823 A1 | 1/2012 | Huai et al. |
| 2012/0018825 A1 | 1/2012 | Lim et al. |
| 2012/0023386 A1 | 1/2012 | Oh et al. |
| 2012/0040207 A1 | 2/2012 | Horng et al. |
| 2012/0061781 A1 | 3/2012 | Ohmori et al. |
| 2012/0068139 A1 | 3/2012 | Daibou et al. |
| 2012/0069647 A1 | 3/2012 | Kramer et al. |
| 2012/0074511 A1 | 3/2012 | Takahashi et al. |
| 2012/0075922 A1 | 3/2012 | Yamada et al. |
| 2012/0075927 A1 | 3/2012 | Chen et al. |
| 2012/0106233 A1 | 5/2012 | Katti |
| 2012/0112297 A1 | 5/2012 | Yamakawa et al. |
| 2012/0134201 A1 | 5/2012 | Ogimoto |
| 2012/0135273 A1 | 5/2012 | Horng et al. |
| 2012/0146167 A1 | 6/2012 | Huai et al. |
| 2012/0155156 A1 | 6/2012 | Watts et al. |
| 2012/0164485 A1 | 6/2012 | Lin |
| 2012/0181537 A1 | 7/2012 | Cao et al. |
| 2012/0182796 A1 | 7/2012 | Uchida et al. |
| 2012/0205758 A1 | 8/2012 | Jan et al. |
| 2012/0217594 A1 | 8/2012 | Kajiyama |
| 2012/0218813 A1 | 8/2012 | Oh et al. |
| 2012/0225499 A1 | 9/2012 | Nozieres et al. |
| 2012/0236631 A1 | 9/2012 | Park et al. |
| 2012/0241878 A1 | 9/2012 | Hu et al. |
| 2012/0241879 A1 | 9/2012 | Ikeno et al. |
| 2012/0261777 A1* | 10/2012 | Shukh .................. H01L 43/08 257/421 |
| 2012/0267733 A1 | 10/2012 | Hu et al. |
| 2012/0280336 A1 | 11/2012 | Jan et al. |
| 2012/0286382 A1 | 11/2012 | Jan et al. |
| 2012/0299134 A1 | 11/2012 | Jan et al. |
| 2012/0299137 A1 | 11/2012 | Worledge |
| 2012/0300542 A1 | 11/2012 | Uchida et al. |
| 2013/0005052 A1 | 1/2013 | Hu et al. |
| 2013/0015539 A1* | 1/2013 | Choi .................. H01L 43/08 257/421 |
| 2013/0028013 A1 | 1/2013 | Ikeda et al. |
| 2013/0032911 A1 | 2/2013 | Jung et al. |
| 2013/0042081 A1 | 2/2013 | Park et al. |
| 2013/0043471 A1 | 2/2013 | Cao et al. |
| 2013/0059168 A1 | 3/2013 | Tahmasebi et al. |
| 2013/0064011 A1 | 3/2013 | Liu et al. |
| 2013/0069185 A1 | 3/2013 | Saida et al. |
| 2013/0075839 A1 | 3/2013 | Chen et al. |
| 2013/0134534 A1 | 5/2013 | Sbiaa et al. |
| 2013/0140658 A1 | 6/2013 | Yamane et al. |
| 2013/0146996 A1 | 6/2013 | Yu et al. |
| 2013/0148418 A1 | 6/2013 | Luo et al. |
| 2013/0154038 A1 | 6/2013 | Horng et al. |
| 2013/0177781 A1 | 7/2013 | Chepulskyy et al. |
| 2013/0209836 A1 | 8/2013 | Ataka et al. |
| 2013/0221459 A1 | 8/2013 | Jan et al. |
| 2013/0224521 A1 | 8/2013 | Wang et al. |
| 2013/0228884 A1 | 9/2013 | Zheng et al. |
| 2013/0229866 A1 | 9/2013 | Ranjan et al. |
| 2013/0236639 A1 | 9/2013 | Carey et al. |
| 2013/0242435 A1 | 9/2013 | Fuji et al. |
| 2013/0250661 A1 | 9/2013 | Sandhu et al. |
| 2013/0288392 A1 | 10/2013 | Nozieres et al. |
| 2013/0288398 A1 | 10/2013 | Yamamoto et al. |
| 2013/0313665 A1 | 11/2013 | Rhie et al. |
| 2013/0314815 A1 | 11/2013 | Yuan et al. |
| 2013/0334630 A1 | 12/2013 | Kula et al. |
| 2013/0334631 A1 | 12/2013 | Kinney et al. |

(56) References Cited

U.S. PATENT DOCUMENTS

| | | |
|---|---|---|
| 2014/0008742 A1 | 1/2014 | Chen et al. |
| 2014/0015076 A1 | 1/2014 | Gan et al. |
| 2014/0021426 A1 | 1/2014 | Lee et al. |
| 2014/0027869 A1 | 1/2014 | Lee et al. |
| 2014/0038312 A1 | 2/2014 | Lee et al. |
| 2014/0063656 A1 | 3/2014 | Hashimoto |
| 2014/0064047 A1 | 3/2014 | Niwa et al. |
| 2014/0070341 A1 | 3/2014 | Beach et al. |
| 2014/0084398 A1 | 3/2014 | Oguz et al. |
| 2014/0099735 A1 | 4/2014 | Horng et al. |
| 2014/0116984 A1 | 5/2014 | Ding et al. |
| 2014/0151843 A1 | 6/2014 | Millward et al. |
| 2014/0157065 A1 | 6/2014 | Ong |
| 2014/0217526 A1 | 8/2014 | Guo |
| 2014/0242419 A1 | 8/2014 | Singh et al. |
| 2014/0264663 A1 | 9/2014 | Chen et al. |
| 2014/0268301 A1 | 9/2014 | Ding et al. |
| 2014/0269064 A1 | 9/2014 | Jeon et al. |
| 2014/0272454 A1 | 9/2014 | Zhang et al. |
| 2014/0287537 A1 | 9/2014 | Shukh |
| 2014/0293436 A1 | 10/2014 | Nagahama et al. |
| 2014/0308542 A1 | 10/2014 | Zhang et al. |
| 2014/0327095 A1 | 11/2014 | Kim et al. |
| 2014/0334032 A1 | 11/2014 | Nishioka et al. |
| 2014/0339504 A1 | 11/2014 | Kim et al. |
| 2014/0367814 A1 | 12/2014 | Ohmori et al. |
| 2015/0028439 A1 | 1/2015 | Kula et al. |
| 2015/0041933 A1* | 2/2015 | Chepulskyy ........ H01F 10/3254 257/421 |
| 2015/0069556 A1 | 3/2015 | Yamakawa et al. |
| 2015/0076485 A1 | 3/2015 | Sandhu et al. |
| 2015/0076633 A1 | 3/2015 | Siddik et al. |
| 2015/0179916 A1 | 6/2015 | Pramanik et al. |
| 2015/0249202 A1 | 9/2015 | Siddik et al. |
| 2015/0270478 A1 | 9/2015 | Annunziata et al. |
| 2015/0287910 A1 | 10/2015 | Lu et al. |
| 2015/0295164 A1 | 10/2015 | Sandhu et al. |
| 2015/0303372 A1 | 10/2015 | Meade et al. |
| 2015/0340601 A1 | 11/2015 | Huai et al. |
| 2016/0005954 A1 | 1/2016 | Erickson et al. |
| 2016/0086645 A1 | 3/2016 | Erickson et al. |
| 2016/0155932 A1 | 6/2016 | Chen et al. |

FOREIGN PATENT DOCUMENTS

| | | |
|---|---|---|
| CN | 101461064 A | 6/2009 |
| CN | 102246327 A | 11/2011 |
| CN | 102610270 A | 7/2012 |
| CN | 104241286 A | 12/2014 |
| EP | 1353443 A2 | 10/2003 |
| EP | 2385548 A1 | 11/2011 |
| EP | 2541554 A1 | 1/2013 |
| EP | 2015307 B1 | 4/2013 |
| GB | 2343308 A | 5/2000 |
| JP | 2002314049 A | 10/2002 |
| JP | 2004104076 A | 4/2004 |
| JP | 2006165059 A | 6/2006 |
| JP | 2008010590 A | 1/2008 |
| JP | 2008270835 A | 11/2008 |
| JP | 2009194366 A | 8/2009 |
| JP | 2010093157 A | 4/2010 |
| JP | 2012064624 A | 3/2012 |
| JP | 2012204432 A | 10/2012 |
| JP | 2013145846 A | 7/2013 |
| KR | 1020040092342 A | 11/2004 |
| KR | 1020070094431 A | 9/2007 |
| KR | 1020080029852 A | 4/2008 |
| KR | 1020120008295 A | 1/2012 |
| WO | 2010026831 A1 | 3/2010 |
| WO | 2010134378 A1 | 11/2010 |
| WO | 2011001746 A1 | 1/2011 |
| WO | 2011149274 A2 | 12/2011 |
| WO | 2011159422 A1 | 12/2011 |
| WO | 2012086183 A1 | 6/2012 |
| WO | 2012128891 A1 | 9/2012 |
| WO | 2012160937 A1 | 11/2012 |
| WO | 2013191920 A1 | 12/2013 |

OTHER PUBLICATIONS

Ando et al., "Electrically Tunable Spin Injector Free from the Impedence Mismatch Problem," Nature Materials, vol. 10 (Sep. 2011), pp. 655-659.

Apalkov et al., Comparison of Scaling of In-Plane and Perpendicular Spin Transfer Switching Technologies by Micromagnetic Simulation, IEEE Transactions on Magnetics, vol. 46, Issue 6, (Jun. 2010), pp. 2240-2243 (abstract only).

Auwarter et al., Co on h-BN/Ni(1 1 1): From Island to Island-Chain Formation and Co Intercalation, Surface Science, vol. 511, (2002), pp. 379-386.

Bai et al., Boron Diffusion Induced Symmetry Reduction and Scattering in CoFeB/MgO/CoFeB Magnetic Tunnel Junctions, Phys. Rev. B, vol. 87, (Jan. 23, 2013), pp. 014114 (abstract only).

Braun et al., Strain-Induced Perpendicular Magnetic Anisotropy in Ultrathin Ni Films on Cu3Au(0 0 1), Journal of Magnetism and Magnetic Materials, vol. 171, (1997), pp. 16-28.

Butler et al., "Spin-Dependent Tunneling Conductance of Fe|MgO|Fe Sandwiches," Physical Review B, vol. 63, (Jan. 8, 2001), 054416-1-054416-12.

Carrey et al., Influence of Interface Alloying on the Magnetic Properties of Co/Pd Multilayers, Applied Physics Letters, vol. 83, No. 25, (Dec. 22, 2003), pp. 5259-5261.

Cha et al., Atomic-Scale Spectroscopic Imaging of CoFeB/Mg—B—O/CoFeB Magnetic Tunnel Junctions, Applied Physics Letters, vol. 95, (2009), pp. 032506-1-032506-3.

Chen et al., Advances and Future Prospects of Spin-Transfer Torque Random Access Memory, IEEE Transactions on Magnetics, vol. 46, No. 6, (Jun. 2010), pp. 1873-1878.

Chen et al., Magnetic Cell Structures, and Methods of Fabrication, U.S. Appl. No. 14/558,367, filed Dec. 2, 2014.

Diao et al., Spin Transfer Switching in Dual MgO Magnetic Tunnel Junctions, Applied Physics Letters, vol. 90, (2007), pp. 132508-1-132508-3.

Djayaprawira et al., 230% Room-Temperature Magnetoresistance in CoFeB/MgO/CoFeB Magnetic Tunnel Junctions, Applied Physics Letters, vol. 86, Issue 9, (2005), 2 pages (abstract only).

Farle et al., The Temperature Dependence of Magnetic Anisotropy in Ultra-Thin Films, Journal of Magnetism and Magnetic Materials, vol. 165, (1997), pp. 74-77.

Gan et al., Origin of the Collapse of Tunnel Magnetoresistance at High Annealing Temperature in CoFeB/MgO Perpendicular Magnetic Tunnel Junctions, Applied Physics Letters, vol. 99, (2011), pp. 252507-1-252507-3.

Gao et al., Combinatorial Exploration of Rare-Earth-Free Permanent Magnets: Magnetic and Microstructural Properties of Fe—Co—W Thin Films, Applied Physics Letters, vol. 102, (2013), pp. 022419-1-022419-4.

Greenwood et al., Chemistry of the Elements, 2d Ed., Butterworth-Heinemann, (1997), pp. 23-25.

Hayakawa et al., Dependence of Giant Tunnel Magnetoresistance of Sputtered CoFeB/MgO/CoFeB Magnetic Tunnel Junctions on MgO Barrier Thickness and Annealing Temperature, Japanese Journal of Applied Physics, vol. 44, No. 19, (2005), pp. L587-L589.

Heczko et al., Strain and Concurrent Magnetization Changes in Magnetic Shape Memory Ni—Mn—Ga Single Crystals—Experiment and Model, Materials Science and Engineering A, vol. 481-482, (2008), pp. 283-287.

Hendrych et al., Magnetic Behavior and Domain Structure in As-Quenched, Annealed, and Stress-Annealed CoFeCrSiB Ribbons, Journal of Magnetism and Magnetic Materials, vol. 321, (2009), pp. 3771-3777.

Hindmarch et al., Zirconium as a Boron Sink in Crystalline CoFeB/MgO/CoFeB Magnetic Tunnel Junctions, Applied Physics Letters, vol. 4, (2011), pp. 013002-1-013002-3.

Ikeda et al., Tunnel Magnetoresistance of 604% at 300 K by Suppression of Ta Diffusion in CoFeB/MgO/CoFeB Pseudo-Spin-

(56) References Cited

OTHER PUBLICATIONS

Valves Annealed at High Temperature, Applied Physics Letters, vol. 93, (2008), pp. 082508-1-082508-3.
International Search Report for International Application No. PCT/US2015/024031, dated Jul. 14, 2015, 4 pages.
International Written Opinion for International Application No. PCT/US2015/024031, dated Jul. 13, 2015, 7 pages.
Kaufman, Myron, "Principles of Thermodynamics," Taylor & Francis Group LLC, (2002), Chap. 7: Chemical Reactions, 9 pages.
Ke et al., Oxygen-Vacancy-Induced Diffusive Scattering in Fe/MgO/Fe Magnetic Tunnel Junctions, Physical Review Letters, vol. 105, (Nov. 30, 2010), pp. 236801-1-236801-4.
Kim et al., Effect of Annealing on Magnetic Exchange Coupling in CoPt/Co Bilayer Thin Films, Journal of Applied Physics, vol. 87, No. 9, (May 1, 2000), pp. 6140-6142.
Kim et al., Enhancement of Data Retention and Write Current Scaling for Sub-20nm STT-MRAM by Utilizing Dual Interfaces for Perpendicular Magnetic Anisotropy, VLSI Technology (VLSIT), 2012 Symposium, (Jun. 12-14, 2012), 1 page (abstract only).
Ko et al., Effects of MgO and MgO/Pd Seed-Layers on Perpendicular Magnetic Anisotropy of CoPd Thin Films, Thin Solid Films, vol. 519, (2011), pp. 8252-8255.
Kohda et al., Width and Temperature Dependence of Lithography-Induced Magnetic Anisotropy in (Ga,Mn)As Wires, Physica E, vol. 42, (2010), pp. 2685-2689.
Kurt et al., Giant Tunnelling Magnetoresistance with Electron Beam Evaporated MgO Barrier and CoFeB Electrodes, Journal of Applied Physics, vol. 107, (2010), pp. 083920-1-083920-6.
Lavrijsen et al., Tuning the Interlayer Exchange Coupling Between Single Perpendicularly Magnetized CoFeB Layers, Appl. Phys. Lett., vol. 100, (2012), pp. 052411-1-052411-5.
Löhndorf et al., Characterization of Magnetostrictive TMR Pressure Sensors by MOKE, Journal of Magnetism and Magnetic Materials, vol. 316, (2007), pp. e223-e225.
Ma et al., NiO-Thickness Dependent Magnetic Anisotropies in Fe/NiO/Au(001) and Fe/NiO/MgO(001) Systems, Journal of Magnetism and Magnetic Materials, vol. 324, (2012), pp. 528-533.
Maehara et al., Tunnel Magnetoresistance Above 170% and Resistance-Area Product of 1 Ω(μm)2 Attained by In Situ Annealing of Ultra-Thin MgO Tunnel Barrier, Applied Physics Express, vol. 4, (2011), 2 pages (abstract only).
Matsumoto et al., Dependence on Annealing Temperatures of Tunneling Spectra in High-Resistance CoFeB/MgO/CoFeB Magnetic Tunnel Junctions, Solid State Communications, vol. 143, (2007), pp. 574-578.
Matsumoto et al., Tunneling Spectra of Sputter-Deposited CoFeB/MgO/CoFeB Magnetic Tunnel Junctions Showing Giant Tunneling Magnetoresistance Effect, Solid State Communications, vol. 136, (2005), pp. 611-615.
Meade et al., Memory Cells, Methods of Fabrication, and Semiconductor Devices, U.S. Appl. No. 14/256,655, filed Apr. 18, 2014.
Miao et al., Disturbance of Tunneling Coherence by Oxygen Vacancy in Epitaxial Fe/MgO/Fe Magnetic Tunnel Junctions, Physical Review Letters, vol. 100, (Jun. 19, 2008), pp. 246803-1-246803-4.
Miao et al., "Theoretical investigation on the transition-metal borides with Ta3B4-type structure: A class of hard and refractory materials," 2011, Computational Materials Science, Elsevier, pp. 1559-1566.
Miracle et al., An Assessment of Binary Metallic Glasses: Correlations Between Structure, Glass Forming Ability and Stability (Preprint), Air Force Research Laboratory, (2011), 97 pages.
Miura et al., CoFeB/MgO Based Perpendicular Magnetic Tunnel Junctions with Stepped Structure for Symmetrizing Different Retention Times of "0" and "1" Information, 2011 Symposium on VLSI Technology (VLSIT), (Jun. 14-16, 2011), 19 pages.
Moroz et al., Modeling the Impact of Stress on Silicon Processes and Devices, Materials Science in Semiconductor Processing, vol. 6, (2003), pp. 27-36.
Moutis et al., Voltage-Induced Modification in Magnetic Coercivity of Patterned Co50Fe50 Thin Film on Piezoelectric Substrate, Journal of Magnetism and Magnetic Materials, vol. 320, (2008), pp. 1050-1055.
Nishitani et al., Magnetic Anisotropy in a Ferromagnetic (Ga,Mn)Sb Thin Film, Physica E, vol. 42, (2010), pp. 2681-2684.
Piramanayagam, S. N., Perpendicular Recording Media for Hard Disk Drives, Journal of Applied Physics, vol. 102, (2007), pp. 011301-1-011301-22.
Resnik et al., Mechanical Stress in Thin Film Microstructures on Silicon Substrate, Vacuum, vol. 80, (2005), pp. 236-240.
Rodmacq et al., Influence of Thermal Annealing on the Perpendicular Magnetic Anisotropy of Pt/Co/AlOx Trilayers, Physical Review B, vol. 79, (2009), pp. 024423-1-024423-8.
Sandhu et al., Memory Cells, Semiconductor Devices, and Methods of Fabrication, U.S. Appl. No. 14/516,347, filed Oct. 16, 2014.
Sato et al., Perpendicular-Anisotropy CoFeB—MgO Magnetic Tunnel Junctions with a MgO/CoFeB/Ta/CoFeB/MgO Recording Structure, Applied Physics Letters, vol. 101, (2012), pp. 022414-1-022414-4.
Siddik et al., Semiconductor Devices, Magnetic Tunnel Junctions, and Methods of Fabrication Thereof, U.S. Appl. No. 14/597,903, filed Jan. 15, 2015.
Stone et al., Tuning of Ferromagnetism Through Anion Substitution in Ga—Mn-Pnictide Ferromagnetic Semiconductors, Physica B, vol. 401-402, (2007), pp. 454-457.
Tao et al., Uniform Wafer-Scale Chemical Vapor Deposition of Graphene on Evaporated Cu (1 1 1) Film with Quality Comparable to Exfoliated Monolayer, J. Physical Chemistry, vol. 116, (2012), pp. 24068-24074.
Vitos et al., The Surface Energy of Metals, Surface Science, vol. 411, (1998), pp. 186-202.
Wang et al., "Low-Power Non-volatile Spintronic Memory: STT-MRAM and Beyond," J. Phys. D: Applied Physics, vol. 46, (Jan. 31, 2013), pp. 1-10.
Wang et al., C-Spin Kickoff Meeting Presentation, Semiconductor Research Corp., (Mar. 26, 2013), Minneapolis, Minnesota, (available at https://www.src.org/library/publication/p066203/), 195 pages.
Wang et al., Exchange Coupling Between Ferromagnetic and Antiferromagnetic Layers Via Ru and Application for a Linear Magnetic Field Sensor, Journal of Applied Physics, vol. 99, (2006), pp. 08H703-1-08H703-3.
Wilson et al., New Materials for Micro-Scale Sensors and Actuators: An Engineering Review, Materials Science and Engineering R, vol. 56, (2007), pp. 1-129.
Worledge et al., Magnetoresistance Measurement of Unpatterned Magnetic Tunnel Junction Wafers by Current-in-Plane Tunneling, Applied Physics Letters, vol. 83, No. 1, (Jul. 7, 2013), pp. 84-86.
Worledge et al., Spin Torque Switching of Perpendicular Ta|CoFeB|MgO-Based Magnetic Tunnel Junctions, Applied Physics Letters, vol. 98, (2011), pp. 022501-1-022501-3.
Wu et al., Tuning Magnetic Anisotropies of Fe Films on Si(111) Substrate Via Direction Variation of Heating Current, Scientific Reports, vol. 3, (Mar. 26, 2013), pp. 1-5.
You et al., Spin Transfer Torque and Tunneling Magnetoresistance Dependences on Finite Bias Voltages and Insulator Barrier Energy, Thin Solid Films, vol. 519, (2011), pp. 8247-8251.
Yu et al., 1/f Noise in MgO Double-Barrier Magnetic Tunnel Junctions, Applied Physics Letters, vol. 98, (2011), pp. 112504-1-112504-3.
Zhang, Anisotropic Magnetomechanical Effect in Tb0.3Dy0.7Fe2 Alloy, Journal of Magnetism and Magnetic Materials, vol. 324, (2012), pp. 190-195.
Zhu et al., Magnetic Tunnel Junctions, MaterialsToday, vol. 9, No. 11, (Nov. 2006), pp. 36-45.
Taiwan Search Report for ROC (Taiwan) Patent Application No. 104111482, (completion date Mar. 9, 2016), 1 page.
Tsunekawa et al., Effect of Capping Layer Material on Tunnel Magnetoresistance in CoFeB—MgO—CoFeB Magentic Tunnel Junctions, Digests of the IEEE International Magnetics Conference (Apr. 2005), pp. 1983-1984.

(56) References Cited

OTHER PUBLICATIONS

Pinitsoontorn et al., Three-Dimensional Atom Probe Investigation of Boron Distribution in Co Fe B/ Mg O/ Co Fe B Magnetic Tunnel Junctions, Applied Physics Letters, vol. 93, (2008), pp. 071901-1-071901-3.
European Supplementary Search Report (completed Oct. 20, 2017) and Written Opinion (dated Nov. 3, 2017) for European Application No. 15777034.8, 12 pages.
Japanese Notice of Rejection for Japanese Application No. 2016-560954, (dated Nov. 21, 2017), 9 pages including English translation.
Lee et al., Improved Magnetic Tunnel Junction with Amorphous Seed Layer, Surface Treatment, and High-Polarization Magnetic Materials, IEEE Transactions on Magnetics, vol. 40, No. 4, (Jul. 2004), pp. 2275-2277.
Chinese Office Action and Search Report for Chinese Application No. 201580027404.2, dated Mar. 30, 2018, 11 pages with English translation.

* cited by examiner

SEMICONDUCTOR STRUCTURES AND DEVICES AND METHODS OF FORMING SEMICONDUCTOR STRUCTURES AND MAGNETIC MEMORY CELLS

CROSS-REFERENCE TO RELATED APPLICATION

This application is a divisional of U.S. patent application Ser. No. 14/249,183, filed Apr. 9, 2014, now U.S. Pat. No. 9,281,466, issued Mar. 8, 2016, the disclosure of which is hereby incorporated in its entirety herein by this reference.

TECHNICAL FIELD

The present disclosure, in various embodiments, relates generally to the field of memory device design and fabrication. More particularly, this disclosure relates to design and fabrication of memory cells characterized as spin torque transfer magnetic random access memory (STT-MRAM) cells, to semiconductor structures employed in such memory cells, and to semiconductor devices incorporating such memory cells.

BACKGROUND

Magnetic Random Access Memory (MRAM) is a non-volatile computer memory technology based on magnetoresistance. One type of MRAM cell is a spin torque transfer MRAM (STT-MRAM) cell, which includes a magnetic cell core supported by a substrate. The magnetic cell core includes at least two magnetic regions, for example, a "fixed region" and a "free region," with a non-magnetic region between. The free region and the fixed region may exhibit magnetic orientations that are either horizontally oriented ("in-plane") or perpendicularly oriented ("out-of-plane") relative to the width of the regions. The fixed region includes a magnetic material that has a substantially fixed (e.g., a non-switchable) magnetic orientation. The free region, on the other hand, includes a magnetic material that has a magnetic orientation that may be switched, during operation of the cell, between a "parallel" configuration and an "anti-parallel" configuration. In the parallel configuration, the magnetic orientations of the fixed region and the free region are directed in the same direction (e.g., north and north, east and east, south and south, or west and west, respectively). In the "anti-parallel" configuration, the magnetic orientations of the fixed region and the free region are directed in opposite directions (e.g., north and south, east and west, south and north, or west and east, respectively). In the parallel configuration, the STT-MRAM cell exhibits a lower electrical resistance across the magnetoresistive elements (e.g., the fixed region and free region). This state of low electrical resistance may be defined as a "0" logic state of the MRAM cell. In the anti-parallel configuration, the STT-MRAM cell exhibits a higher electrical resistance across the magnetoresistive elements. This state of high electrical resistance may be defined as a "1" logic state of the STT-MRAM cell.

Switching of the magnetic orientation of the free region may be accomplished by passing a programming current through the magnetic cell core and the fixed and free regions therein. The fixed region polarizes the electron spin of the programming current, and torque is created as the spin-polarized current passes through the core. The spin-polarized electron current exerts the torque on the free region. When the torque of the spin-polarized electron current passing through the core is greater than a critical switching current density ($J_c$) of the free region, the direction of the magnetic orientation of the free region is switched. Thus, the programming current can be used to alter the electrical resistance across the magnetic regions. The resulting high or low electrical resistance states across the magnetoresistive elements enable the write and read operations of the MRAM cell. After switching the magnetic orientation of the free region to achieve the one of the parallel configuration and the anti-parallel configuration associated with a desired logic state, the magnetic orientation of the free region is usually desired to be maintained, during a "storage" stage, until the MRAM cell is to be rewritten to a different configuration (i.e., to a different logic state).

A magnetic region's magnetic anisotropy ("MA") is an indication of the directional dependence of the material's magnetic properties. Therefore, the MA is also an indication of the strength of the material's magnetic orientation and of its resistance to alteration of its orientation. Interaction between certain nonmagnetic material (e.g., oxide material) and magnetic material may induce MA (e.g., increase MA strength) along a surface of the magnetic material, adding to the overall MA strength of the magnetic material and the MRAM cell. A magnetic material exhibiting a magnetic orientation with a high MA strength may be less prone to alteration of its magnetic orientation than a magnetic material exhibiting a magnetic orientation with a low MA strength. Therefore, a free region with a high MA strength may be more stable during storage than a free region with a low MA strength.

Other beneficial properties of free regions are often associated with the microstructure of the free regions. These properties include, for example, the cell's tunnel magnetoresistance ("TMR"). TMR is a ratio of the difference between the cell's electrical resistance in the anti-parallel configuration ($R_{ap}$) and its resistance in the parallel configuration ($R_p$) to $R_p$ (i.e., TMR=$(R_{ap}-R_p)/R_p$). Generally, a free region with a consistent crystal structure (e.g., a bcc (001) crystal structure) having few structural defects in the microstructure of its magnetic material has a higher TMR than a thin free region with structural defects. A cell with high TMR may have a high read-out signal, which may speed the reading of the MRAM cell during operation. High TMR may also enable use of low programming current.

Efforts have been made to form free regions having high MA strength and having microstructures that are conducive for high TMR. However, because compositions and fabrication conditions that promote a desirable characteristic—such as a characteristic that enables high MA, high TMR, or both—often inhibit other characteristics or performance of the MRAM cell, forming MRAM cells that have both high MA strength and high TMR has presented challenges.

For example, efforts to form magnetic material at a desired crystal structure include propagating the desired crystal structure to the magnetic material (referred to herein as the "targeted magnetic material") from a neighboring material (referred to herein as the "seed material"). However, propagating the crystal structure may be inhibited, or may lead to microstructural defects in the targeted magnetic material, if the seed material has defects in its crystal structure, if the targeted magnetic material has a competing crystal structure to that of the crystal material, or if competing crystal structures are also propagating to the targeted magnetic material from materials other than the seed material.

Efforts to ensure that the seed material has a consistent, defect-free crystal structure that can be successfully propagated to a targeted magnetic material have included annealing the seed material. However, because both the seed material and the targeted magnetic material are often simultaneously exposed to the annealing temperatures, while the anneal improves the crystal structure of the seed material, the anneal may also begin crystallization of other materials, including the targeted magnetic material and other neighboring materials. This other crystallization can compete with and inhibit the propagation of the desired crystal structure from the seed material.

Efforts to delay crystallization of the targeted magnetic material, until after the seed material is crystallized into a desired crystal structure, have included incorporating an additive into the targeted magnetic material, when initially formed, so that the targeted magnetic material is initially amorphous. For example, where the targeted magnetic material is a cobalt-iron (CoFe) magnetic material, boron (B) may be added so that a cobalt-iron-boron (CoFeB) magnetic material may be used as a precursor material and formed in an initially-amorphous state. The additive may diffuse out of the targeted magnetic material during the anneal, enabling the targeted magnetic material to crystallize under propagation from the seed material, after the seed material has crystallized into the desired crystal structure. While these efforts may decrease the likelihood that the targeted magnetic material will be initially formed with a microstructure that will compete with the crystal structure to be propagated from the seed material, the efforts do not inhibit the propagation of competing crystal structures from neighboring materials other than the seed material. Moreover, the additive diffusing from the targeted magnetic material may diffuse to regions within the structure where the additive interferes with other characteristics of the structure, e.g., MA strength. Therefore, forming a magnetic material with a desired microstructure, e.g., to enable a high TMR, while not deteriorating other characteristics of the magnetic material or the resulting structure, such as MA strength, can present challenges.

BRIEF DESCRIPTION OF THE DRAWINGS

FIGS. 6 through 9C are cross-sectional, elevational, schematic illustrations during various stages of processing to fabricate the magnetic cell structures of FIGS. 1, 1A, and 1B, according to embodiments of the present disclosure, wherein:

FIG. 6 is a cross-sectional, elevational, schematic illustration of a structure during a stage of processing, the structure including a precursor trap material;

FIG. 7 is a cross-sectional, elevational, schematic illustration of a structure during a stage of processing subsequent to that of FIGS. 6 and 6D, and preceding that of FIG. 6E;

FIG. 8 is a cross-sectional, elevational, schematic illustration of an annealed structure during a stage of processing subsequent to that of FIGS. 7 and 7A and concurrent with that of FIG. 6F;

FIG. 9C is an enlarged view of box 9C of FIG. 9B, illustrating a stage of processing subsequent to that of FIG. 9B.

DETAILED DESCRIPTION

Figure 1:
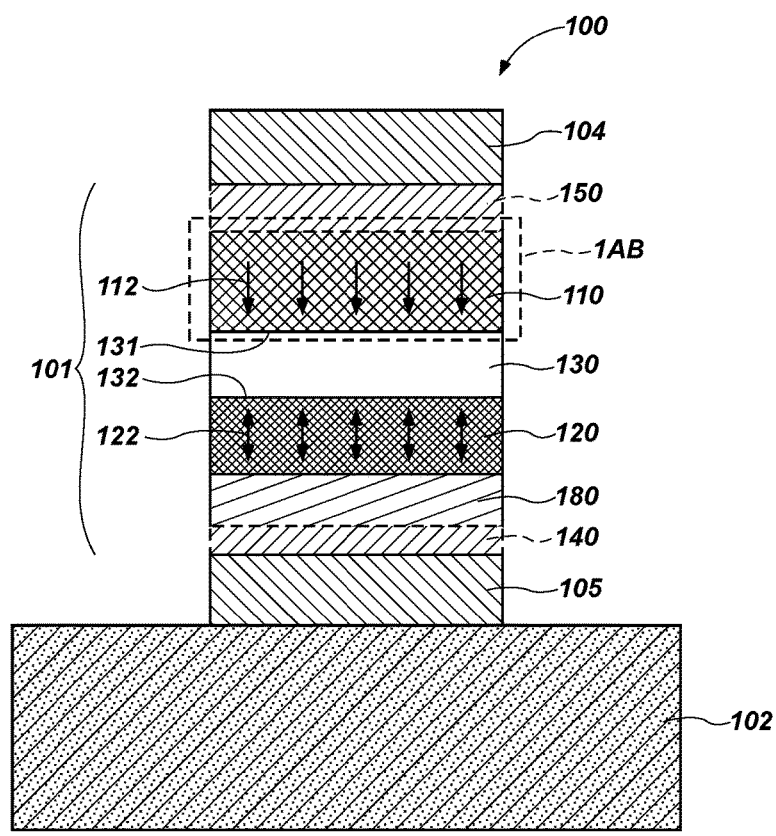
FIG. 1 is a cross-sectional, elevational, schematic illustration of a magnetic cell structure according to an embodiment of the present disclosure, wherein the magnetic cell structure includes a fixed region overlying a free region, a single oxide region, and a trap region proximate to the free region.

Memory cells, semiconductor structures, semiconductor devices, memory systems, electronic systems, methods of forming memory cells, and methods of forming semiconductor structures are disclosed. During fabrication of the memory cell, a "diffusive species" is at least partially removed from a magnetic material, which may also be characterized as a "precursor magnetic material," due to proximity of the precursor magnetic material to a "precursor trap material" that includes at least one attracter species. The at least one attracter species has at least one trap site and has a higher chemical affinity for the diffusive species compared to a chemical affinity between the diffusive species and other species in the precursor magnetic material. The diffusive species may diffuse from the precursor magnetic material to the precursor trap material. Therein, the diffused species may bond with the attracter species at what was the trap site. The removal of the diffusive species from the precursor magnetic material, which forms what may be characterized as a "depleted magnetic material," promotes crystallization of the depleted magnetic material into a desired crystal structure (e.g., a bcc (001) structure). Moreover, the presence of the diffused species in the precursor trap material, which forms what may be characterized as an "enriched precursor trap material," and intermixing of the species of the enriched precursor trap material, may form an enriched trap material that has a microstructure, e.g., an amorphous microstructure, that does not adversely impact the magnetic material's ability to crystallize into the desired crystal structure. Thus, the depleted magnetic material may be crystallized into a microstructure that enables a memory cell including the depleted magnetic material to exhibit high tunnel magnetoresistance ("TMR") and to have magnetic anisotropy ("MA") induced, along interfaces of the magnetic material (e.g., the depleted magnetic material), by one or more neighboring oxide materials.

As used herein, the term "substrate" means and includes a base material or other construction upon which components, such as those within memory cells, are formed. The substrate may be a semiconductor substrate, a base semiconductor material on a supporting structure, a metal electrode, or a semiconductor substrate having one or more materials, structures, or regions formed thereon. The substrate may be a conventional silicon substrate or other bulk substrate including a semiconductive material. As used herein, the term "bulk substrate" means and includes not only silicon wafers, but also silicon-on-insulator ("SOI") substrates, such as silicon-on-sapphire ("SOS") substrates or silicon-on-glass ("SOG") substrates, epitaxial layers of silicon on a base semiconductor foundation, or other semiconductor or optoelectronic materials, such as silicon-germanium ($Si_{1-x}Ge_x$, where x is, for example, a mole fraction between 0.2 and 0.8), germanium (Ge), gallium arsenide (GaAs), gallium nitride (GaN), or indium phosphide (InP), among others. Furthermore, when reference is made to a "substrate" in the following description, previous process stages may have been utilized to form materials, regions, or junctions in the base semiconductor structure or foundation.

As used herein, the term "STT-MRAM cell" means and includes a magnetic cell structure that includes a magnetic cell core including a nonmagnetic region disposed between a free region and a fixed region. The nonmagnetic region may be an electrically insulative (e.g., dielectric) region, in a magnetic tunnel junction ("MTJ") configuration. For example, the nonmagnetic region, between the free and fixed regions, may be an oxide region (referred to herein as the "intermediate oxide region").

As used herein, the term "secondary oxide region" refers to an oxide region of an STT-MRAM cell other than the intermediate oxide region. The secondary oxide region may be formulated and positioned to induce magnetic anisotropy ("MA") with a neighboring magnetic material.

As used herein, the term "magnetic cell core" means and includes a memory cell structure comprising the free region and the fixed region and through which, during use and operation of the memory cell, current may be passed (i.e., flowed) to effect a parallel or anti-parallel configuration of the magnetic orientations of the free region and the fixed region.

As used herein, the term "magnetic region" means a region that exhibits magnetism. A magnetic region includes a magnetic material and may also include one or more non-magnetic materials.

As used herein, the term "magnetic material" means and includes ferromagnetic materials, ferrimagnetic materials, antiferromagnetic, and paramagnetic materials.

As used herein, the terms "CoFeB material" and "CoFeB precursor material" mean and include a material comprising cobalt (Co), iron (Fe), and boron (B) (e.g., $Co_xFe_yB_z$, wherein x=10 to 80, y=10 to 80, and z=0 to 50). A CoFeB material or a CoFeB precursor material may or may not exhibit magnetism, depending on its configuration (e.g., its thickness).

As used herein, the term "species" means and includes an element or elements from the Periodic Table of Elements composing a material. For example, and without limitation, in a CoFeB material, each of Co, Fe, and B may be referred to as a species of the CoFeB material.

As used herein, the term "diffusive species" means and includes a chemical species of a material, the presence of which in the material is not necessary or, in at least one instance, desirable for the functionality of the material. For example, and without limitation, in a CoFeB material of a magnetic region, B (boron) may be referred to as a diffusive species to the extent that the presence of B in combination with Co and Fe is not necessary for the Co and Fe to function as a magnetic material (i.e., to exhibit magnetism). Following diffusion, the "diffusive species" may be referred to as a "diffused species."

As used herein, the term "depleted," when used to describe a material, describes a material resulting from removal, in whole or part, of a diffusive species from a precursor material.

As used herein, the term "enriched," when used to describe a material, describes a material to which the diffused species has been added (e.g., transferred).

As used herein, the term "precursor," when referring to a material, region, or structure, means and refers to a material, region, or structure to be transformed into a resulting material, region, or structure. For example, and without limitation, a "precursor material" may refer to a material from which a species is to be diffused to transform the precursor material into a depleted material; a "precursor material" may refer to a material into which a species is to be diffused to transform the precursor material into an enriched material; a "precursor material" may refer to an unsaturated material having trap sites with which a species is to be chemically bonded to convert the "precursor material" into a material in which the once-available trap sites are now occupied by the species; and "a precursor structure" may refer to a structure of materials or regions to be patterned to transform the precursor structure into a resulting, patterned structure.

As used herein, unless the context indicates otherwise, the term "formed from," when describing a material or region, refers to a material or region that has resulted from an act that produced a transformation of a precursor material or precursor region.

As used herein, the term "chemical affinity" means and refers to the electronic property by which dissimilar chemical species tend to form chemical compounds. Chemical affinity may be indicated by the heat of formation of the chemical compound. For example, a first material described as having a higher chemical affinity for a diffusive species of a second material compared to the chemical affinity between the diffusive species and other species of the second material means and includes that a heat of formation of a chemical compound that includes the diffusive species and at least one species from the first material is lower than a heat of formation of a chemical compound that includes the diffusive species and the other species of the second material.

As used herein, the term "unsaturated material" means and refers to a material comprising atoms having at least one trap site.

As used herein, the term "trap site" means and refers to at least one of an under-coordinated, frustrated, or dangling bond or point defect of an atom or structure of the material comprising the trap site. For example, and without limitation, a "trap site" includes an unsatisfied valence on an atom. Due to the unsatisfied coordination or valency, the trap site is highly reactive, and, in case of covalent bonding, the unpaired electrons of the dangling bond react with electrons in other atoms in order to fill the valence shell of the atom. The atom with a trap site may be a free radical in an immobilized material, e.g., a solid.

As used herein, the term "amorphous," when referring to a material, means and refers to a material having a noncrystalline structure. For example, and without limitation, an "amorphous" material includes glass.

As used herein, the term "fixed region" means and includes a magnetic region within the STT-MRAM cell that includes a magnetic material and that has a fixed magnetic orientation during use and operation of the STT-MRAM cell in that a current or applied field effecting a change in the magnetization direction of one magnetic region (e.g., the free region) of the cell core may not effect a change in the magnetization direction of the fixed region. The fixed region may include one or more magnetic materials and, optionally, one or more non-magnetic materials. For example, the fixed region may be configured as a synthetic antiferromagnet (SAF) including a sub-region of ruthenium (Ru) adjoined by magnetic sub-regions. Alternatively, the fixed region may be configured with structures of alternating sub-regions of magnetic material and coupler material. Each of the magnetic sub-regions may include one or more materials and one or more regions therein. As another example, the fixed region may be configured as a single, homogeneous magnetic material. Accordingly, the fixed region may have uniform magnetization, or sub-regions of differing magnetization that, overall, effect the fixed region having a fixed magnetic orientation during use and operation of the STT-MRAM cell.

As used herein, the term "coupler," when referring to a material, region, or sub-region, means and includes a material, region, or sub-region formulated or otherwise configured to antiferromagnetically couple neighboring magnetic materials, regions, or sub-regions.

As used herein, the term "free region" means and includes a magnetic region within the STT-MRAM cell that includes a magnetic material and that has a switchable magnetic orientation during use and operation of the STT-MRAM cell. The magnetic orientation may be switched between a parallel configuration and an anti-parallel configuration by the application of a current or applied field.

As used herein, "switching" means and includes a stage of use and operation of the memory cell during which programming current is passed through the magnetic cell core of the STT-MRAM cell to effect a parallel or anti-parallel configuration of the magnetic orientations of the free region and the fixed region.

As used herein, "storage" means and includes a stage of use and operation of the memory cell during which programming current is not passed through the magnetic cell core of the STT-MRAM cell and in which the parallel or anti-parallel configuration of the magnetic orientations of the free region and the fixed region is not purposefully altered.

As used herein, the term "vertical" means and includes a direction that is perpendicular to the width and length of the respective region. "Vertical" may also mean and include a direction that is perpendicular to a primary surface of the substrate on which the STT-MRAM cell is located.

As used herein, the term "horizontal" means and includes a direction that is parallel to at least one of the width and length of the respective region. "Horizontal" may also mean and include a direction that is parallel to a primary surface of the substrate on which the STT-MRAM cell is located.

As used herein, the term "sub-region," means and includes a region included in another region. Thus, one magnetic region may include one or more magnetic sub-regions, i.e., sub-regions of magnetic material, as well as non-magnetic sub-regions, i.e., sub-regions of non-magnetic material.

As used herein, the term "between" is a spatially relative term used to describe the relative disposition of one material, region, or sub-region relative to at least two other materials, regions, or sub-regions. The term "between" can encompass both a disposition of one material, region, or sub-region directly adjacent to the other materials, regions, or sub-regions and a disposition of one material, region, or sub-region indirectly adjacent to the other materials, regions, or sub-regions.

As used herein, the term "proximate to" is a spatially relative term used to describe disposition of one material, region, or sub-region near to another material, region, or sub-region. The term "proximate" includes dispositions of indirectly adjacent to, directly adjacent to, and internal to.

As used herein, reference to an element as being "on" or "over" another element means and includes the element being directly on top of, adjacent to, underneath, or in direct contact with the other element. It also includes the element being indirectly on top of, adjacent to, underneath, or near the other element, with other elements present therebetween. In contrast, when an element is referred to as being "directly on" or "directly adjacent to" another element, there are no intervening elements present.

As used herein, other spatially relative terms, such as "below," "lower," "bottom," "above," "upper," "top," and the like, may be used for ease of description to describe one element's or feature's relationship to another element(s) or feature(s) as illustrated in the figures. Unless otherwise specified, the spatially relative terms are intended to encompass different orientations of the materials in addition to the orientation as depicted in the figures. For example, if materials in the figures are inverted, elements described as "below" or "under" or "on bottom of" other elements or features would then be oriented "above" or "on top of" the other elements or features. Thus, the term "below" can encompass both an orientation of above and below, depending on the context in which the term is used, which will be evident to one of ordinary skill in the art. The materials may be otherwise oriented (rotated 90 degrees, inverted, etc.) and the spatially relative descriptors used herein interpreted accordingly.

As used herein, the terms "comprises," "comprising," "includes," and/or "including" specify the presence of stated features, regions, stages, operations, elements, materials, components, and/or groups, but do not preclude the presence or addition of one or more other features, regions, stages, operations, elements, materials, components, and/or groups thereof.

As used herein, "and/or" includes any and all combinations of one or more of the associated listed items.

As used herein, the singular forms "a," "an," and "the" are intended to include the plural forms as well, unless the context clearly indicates otherwise.

The illustrations presented herein are not meant to be actual views of any particular material, species, structure, device, or system, but are merely idealized representations that are employed to describe embodiments of the present disclosure.

Embodiments are described herein with reference to cross-sectional illustrations that are schematic illustrations. Accordingly, variations from the shapes of the illustrations as a result, for example, of manufacturing techniques and/or tolerances, are to be expected. Thus, embodiments described herein are not to be construed as limited to the particular shapes or regions as illustrated but may include deviations in shapes that result, for example, from manufacturing techniques. For example, a region illustrated or described as box-shaped may have rough and/or nonlinear features. Moreover, sharp angles that are illustrated may be rounded. Thus, the materials, features, and regions illustrated in the figures are schematic in nature and their shapes are not intended to illustrate the precise shape of a material, feature, or region and do not limit the scope of the present claims.

The following description provides specific details, such as material types and processing conditions, in order to provide a thorough description of embodiments of the disclosed devices and methods. However, a person of ordinary skill in the art will understand that the embodiments of the devices and methods may be practiced without employing these specific details. Indeed, the embodiments of the devices and methods may be practiced in conjunction with conventional semiconductor fabrication techniques employed in the industry.

The fabrication processes described herein do not form a complete process flow for processing semiconductor device structures. The remainder of the process flow is known to those of ordinary skill in the art. Accordingly, only the methods and semiconductor device structures necessary to understand embodiments of the present devices and methods are described herein.

Unless the context indicates otherwise, the materials described herein may be formed by any suitable technique including, but not limited to, spin coating, blanket coating, chemical vapor deposition ("CVD"), atomic layer deposition ("ALD"), plasma enhanced ALD, physical vapor deposition ("PVD") (e.g., sputtering), or epitaxial growth. Depending on the specific material to be formed, the technique for depositing or growing the material may be selected by a person of ordinary skill in the art.

Unless the context indicates otherwise, the removal of materials described herein may be accomplished by any suitable technique including, but not limited to, etching, ion milling, abrasive planarization, or other known methods.

Reference will now be made to the drawings, where like numerals refer to like components throughout. The drawings are not necessarily drawn to scale.

A memory cell is disclosed. The memory cell includes a magnetic cell core that includes an amorphous region proximate to a magnetic region. The amorphous region is formed from a precursor trap material that comprises at least one attracter species having at least one trap site. The attracter species has a chemical affinity for a diffusive species of a precursor magnetic material from which the magnetic region is formed. Therefore, the attracter species is selected to attract the diffusive species from the precursor magnetic material, and the precursor trap material is configured, with its trap sites, to provide sites at which the diffused species may react with and bond to the attracter species.

To promote the presence of trap sites in the precursor trap material, the precursor trap material may be configured to include alternating sub-regions of a plurality of attracter species, such that trap sites are prevalent at multiple interfaces between the sub-regions. Alternatively or additionally, the presence of trap sites may be promoted by bombarding the precursor trap material, e.g., with a "bombarding species," to form additional trap sites in the material. The increased concentration of trap sites of one or more attracter species in the precursor trap material configures the precursor trap material to attract the diffusive species from the precursor magnetic material and to retain, at least substantially, the diffused species in the enriched trap material.

The removal of the diffusive species from the precursor magnetic material may enable and improve crystallization of the depleted magnetic material. For example, once the diffusive species has been removed from the precursor magnetic material, a crystalline structure may propagate to the depleted magnetic material from a neighboring crystalline material, e.g., a crystalline oxide material. Moreover, the enriched trap material may remain or become amorphous, once the diffused species intermixes with the at least one attracter species and any other species of the enriched trap material, if present. The amorphous nature of the enriched trap material may not compete with or otherwise negatively impact the propagation of the crystal structure from the adjacent crystalline material to the depleted magnetic material. In some embodiments, the enriched trap material may be amorphous even at high temperatures (e.g., greater than about 300° C., e.g., greater than about 500° C.). Therefore, a high-temperature anneal may be used to promote the crystallization of the depleted magnetic material without crystallizing the enriched trap material. The crystallization of the depleted magnetic material may enable a high TMR (e.g., greater than about 100%, e.g., greater than about 200%). Moreover, the retention of the diffused species in the enriched trap material, via the once-available trap sites may inhibit the diffused species from interfering with MA-inducement along the interface between the magnetic region and an adjacent intermediate oxide region. Without being limited to any one theory, it is contemplated that bonds between the nonmagnetic and magnetic materials (e.g., between iron (Fe), in the magnetic region, and oxygen (O) in the nonmagnetic region, i.e., iron-oxygen (Fe—O) bonds), may contribute to the MA strength. Less or no diffusive species at the interface may enable more MA-inducing bonds to be formed. Therefore, the lack of interference by the diffused species with the MA-inducing bonds may enable high MA strength. Thus, a magnetic memory cell, with an amorphous, enriched trap region formed from a precursor trap material having trap sites, may be formed with both high TMR and high MA strength.

FIG. 1 illustrates an embodiment of a magnetic cell structure 100 according to the present disclosure. The magnetic cell structure 100 includes a magnetic cell core 101 over a substrate 102. The magnetic cell core 101 may be disposed between an upper electrode 104 and a lower electrode 105. The magnetic cell core 101 includes a magnetic region and another magnetic region, for example, a "fixed region" 110 and a "free region" 120, respectively, with an oxide region (e.g., an "intermediate oxide region" 130) between. The intermediate oxide region 130 may be configured as a tunnel region and may contact the fixed region 110 along interface 131 and may contact the free region 120 along interface 132.

Either or both of the fixed region 110 and the free region 120 may be formed homogeneously or, optionally, may be formed to include more than one sub-region. For example, with reference to FIG. 1A, in some embodiments, a fixed region 110' of the magnetic cell core 101 (FIG. 1) may include multiple portions. For example, the fixed region 110' may include a magnetic sub-region as an oxide-adjacent portion 113. An intermediate portion 115, such as a conductive sub-region, may separate the oxide-adjacent portion 113 from an electrode-adjacent portion 117. The electrode-adjacent portion 117 may include an alternating structure of magnetic sub-regions 118 and coupler sub-regions 119.

With continued reference to FIG. 1, one or more lower intermediary regions 140 may, optionally, be disposed under the magnetic regions (e.g., the fixed region 110 and the free region 120), and one or more upper intermediary regions 150 may, optionally, be disposed over the magnetic regions of the magnetic cell structure 100. The lower intermediary regions 140 and the upper intermediary regions 150, if included, may be configured to inhibit diffusion of species between the lower electrode 105 and overlying materials and between the upper electrode 104 and underlying materials, respectively, during operation of the memory cell.

The free region 120 is formed proximate to a trap region 180. The trap region 180 is formed from a precursor trap material comprising at least one attracter species that had trap sites. The precursor trap material is also referred to herein as an "unsaturated attracter material." The trap sites may be formed as the result of, for example and without limitation, a mismatched lattice structure of alternating sub-regions of attracter species, bombarding an attracter material with a bombarding species (e.g., ion and plasma) to form the trap sites (i.e., by breaking existing bonds), or both.

The attracter species is formulated to have a higher chemical affinity for a diffusive species from a precursor magnetic material, neighboring the attracter species, than the chemical affinity between other species of the neighboring, precursor magnetic material and the diffusive species. The initial presence of the diffusive species in the precursor magnetic material may inhibit crystallization of the precursor magnetic material, but the proximity of the trap region 180 to the precursor magnetic material may enable diffusion of the diffusive species from the precursor magnetic material to material of the trap region 180. Once diffused, the diffused species may chemically react with the attracter species at what were the trap sites.

The removal of the diffusive species from the precursor magnetic material leaves a depleted magnetic material (i.e., a magnetic material with a lower concentration of the diffusive species compared to a concentration before diffusion) that is able to crystallize into a desired crystal structure (e.g., a bcc (001)). The desired crystal structure may be propagated from one or more neighboring materials, e.g., the oxide of the intermediate oxide region 130. The crystallized, depleted magnetic material, having the desired crystal structure, may exhibit high TMR (e.g., greater than about 100% (about 1.00), e.g., greater than about 200% (about 2.00).

In some embodiments, the trap region 180 may be formulated to be amorphous and remain amorphous while the neighboring depleted magnetic material crystallizes. In some such embodiments, precursor material of the trap region 180 may be non-amorphous, i.e., crystalline, when initially formed, but the precursor material may be converted into an amorphous structure once the diffused species, from the precursor magnetic material, has been received and intermixed with the precursor material of trap region 180, e.g., during an anneal. In other embodiments, the precursor material of the trap region 180 may be amorphous when initially formed and may remain amorphous even at high temperatures, e.g., during an anneal, and even once enriched with the diffused species. Thus, the material of the trap region 180 may not inhibit the crystallization of the neighboring depleted magnetic material.

The thickness, composition, and structure of the trap region 180 may be selected to provide a sufficient amount of unsaturated attracter material (i.e., a sufficient number of trap sites) in the trap region 180 to have a desired capacity to receive and bond with the diffused species from the neighboring precursor magnetic material. A thicker trap region may have a relatively higher capacity for the diffused species, compared to a thinner trap region. According to an embodiment such as that illustrated in FIG. 1, the trap region 180 may be between about 10 Å (about 1.0 nm) to about 100 Å (about 10.0 nm) in thickness.

Figures 1A, 1B:
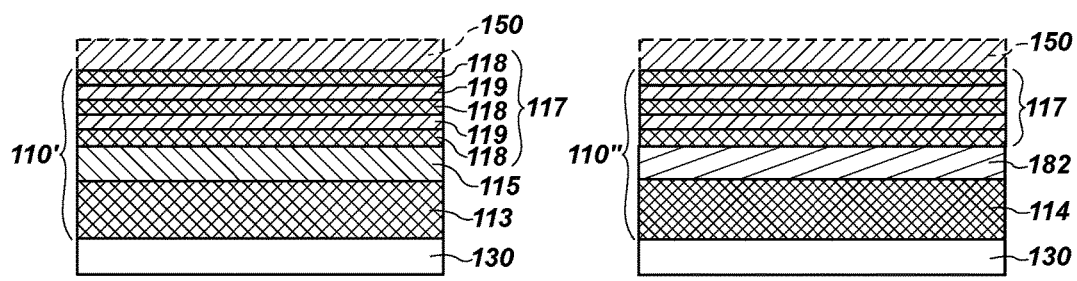
FIG. 1A is an enlarged view of box 1AB of FIG. 1, according to an alternate embodiment of the present disclosure, wherein the fixed region includes an oxide-adjacent portion, an intermediate portion, and an electrode-adjacent portion.
FIG. 1B is an enlarged view of box 1AB of FIG. 1, according to another alternate embodiment of the present disclosure, wherein the fixed region includes an oxide-adjacent portion, an intermediate trap portion, and an electrode-adjacent portion.

With reference to FIG. 1B, in some embodiments, additional trap regions may be present. For example, another trap region 182 may be included in the magnetic cell core 101 (FIG. 1). The another trap region 182 may be proximate to magnetic material (e.g., the precursor magnetic material, initially, and, subsequently, the depleted magnetic material) of a fixed region 110". In some embodiments, the another trap region 182 may form an intermediate portion of the fixed region 110", between an oxide-adjacent portion 114 and the electrode-adjacent portion 117.

The another trap region 182 also includes at least one attracter species, which may be the same as or different than the attracter species of the trap region 180 adjacent the free region 120. The at least one attracter species of the another trap region 182 also included, prior to receipt of a diffused species, trap sites. Thus, the another trap region 182 may be formulated, structured, and disposed so as to attract a diffusive species from a neighboring precursor magnetic material (e.g., of the oxide-adjacent portion 114) and to react with the diffused species, to promote crystallization of the depleted magnetic material. The another trap region 182 may be amorphous, e.g., once the diffused species has bonded to the attracter species and the attracter and diffused species have intermixed. The another trap region 182, thus enriched with the diffused species, may remain amorphous as the neighboring depleted magnetic material crystallizes, so as to not interfere with the crystallization.

With continued reference to FIG. 1, in embodiments in which the trap region 180 is proximate to the free region 120, the trap region 180 may be physically isolated from the fixed region 110 by one or more other regions, e.g., by the free region 120 and the intermediate oxide region 130. Therefore, species of the trap region 180 may not chemically react with species of the fixed region 110.

In embodiments such as that of FIG. 1B, the another trap region 182, proximate to the fixed region 110" may be physically isolated from the free region 120 by one or more other regions, e.g., by the oxide-adjacent portion 114 of the fixed region 110" and by the intermediate oxide region 130. Therefore, species of the another trap region 182 may not chemically react with species of the free region 120.

The magnetic cell structure 100 of FIG. 1 is configured as a "top-pinned" memory cell, i.e., a memory cell in which the fixed region 110 is disposed over the free region 120. The magnetic cell structure 100 also includes a single oxide region, i.e., the intermediate oxide region 130, which may be configured to induce MA in the free region 120 and to function as a tunnel region of a magnetic tunnel junction (MTJ) effected by interaction of the free region 120, the intermediate oxide region 130, and the fixed region 110.

Figure 2:
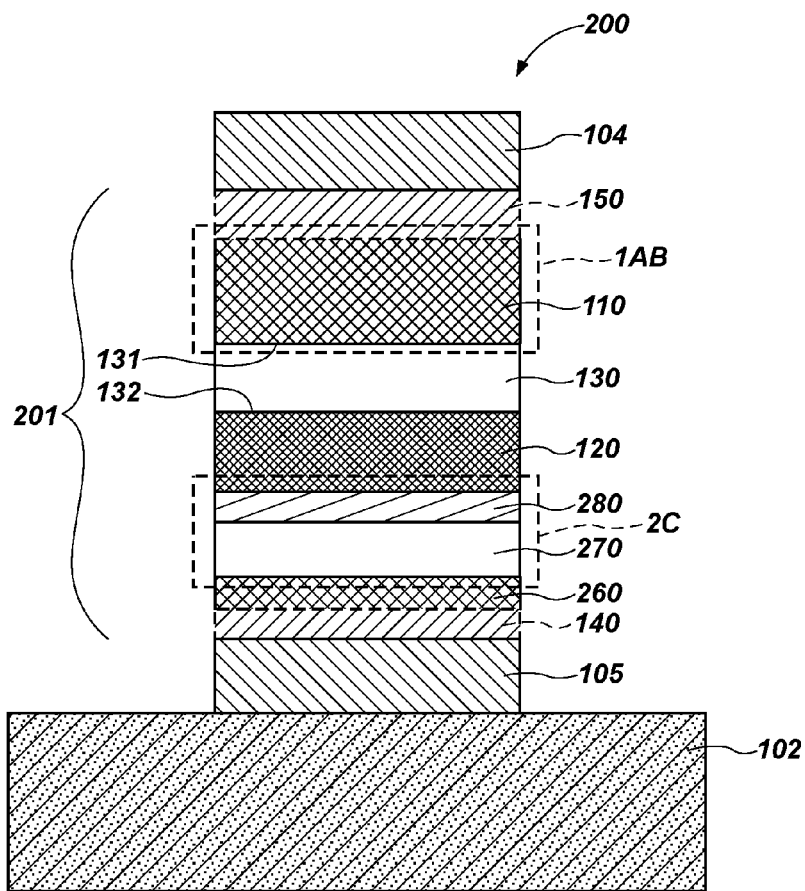
FIG. 2 is a cross-sectional, elevational, schematic illustration of a magnetic cell structure according to an embodiment of the present disclosure, wherein the magnetic cell structure includes a fixed region overlying a free region, dual oxide regions proximate to the free region, and a trap region also proximate to the free region.

Alternatively, with reference to FIG. 2, a magnetic cell structure 200, according to an embodiment of the present disclosure, may be configured as a top-pinned memory cell with a magnetic cell core 201 having dual MA-inducing oxide regions (e.g., the intermediate oxide region 130 and a secondary oxide region 270). In some embodiments, such as that illustrated in FIG. 2, the secondary oxide region 270 may be formed over (e.g., directly on) a foundation region 260, such that an upper surface of the foundation region 260 and a lower surface of the secondary oxide region 270 may contact one another.

The foundation region 260 may provide a smooth template upon which overlying materials, such as material of the secondary oxide region 270, are formed. In some embodiments, the foundation region 260 is formulated and configured to enable formation of the secondary oxide region 270 to exhibit a crystal structure that enables formation of the free region 120, over the secondary oxide region 270, with a desired crystal structure (e.g., a bcc (001) crystal structure). For example, and without limitation, the foundation region 260 may enable the secondary oxide region 270 to be formed thereon with the bcc (001) crystal structure or later crystallized into the bcc (001) crystal structure, which structure may be propagated to a depleted magnetic material from which the free region 120 is to be formed.

In some embodiments, the foundation region 260 may be formed directly on the lower electrode 105. In other embodiments, such as that illustrated in FIG. 2, the foundation region 260 may be formed on the one or more lower intermediary regions 140.

In the magnetic cell core 201, the second of the dual oxide regions, i.e., the secondary oxide region 270, may be disposed proximate to the free region 120, e.g., adjacent to a surface of the free region 120 that is opposite a surface of the free region 120 proximate to the intermediate oxide region 130. Thus, the secondary oxide region 270 may be spaced from the intermediate oxide region 130 by the free region 120.

The trap region 280 may separate the free region 120 from the secondary oxide region 270. Nonetheless, it is contemplated that the trap region 280 may be formed to a thickness that enables MA inducement between the free region 120 and the secondary oxide region 270, even without the free region 120 and the secondary oxide region 270 being in direct physical contact. For example, the trap region 280 may be thin (e.g., less than about 6 Å (less than about 0.6 nm) in thickness (e.g., between about 2.5 Å (about 0.25 nm) and about 5 Å (about 0.5 nm) in height)). Thus, the trap region 280 may not substantially degrade the MA-inducement between the oxide region (e.g., the secondary oxide region 270) and the magnetic region (e.g., the free region 120). Accordingly, a magnetic region may be crystallized in a structure that promotes high TMR while an adjacent oxide region promotes high MA strength.

In the top-pinned, dual oxide region configuration of FIG. 2, the fixed region 110 may, alternatively, be configured as either the fixed region 110' of FIG. 1A or the fixed region 110" of FIG. 1B, as discussed above. Thus, as with the fixed region 110" of FIG. 1B, the magnetic cell structure 200 may include more than one trap region (e.g., the trap region 280 (FIG. 2) and the another trap region 182 (FIG. 1B)).

Figure 2C:
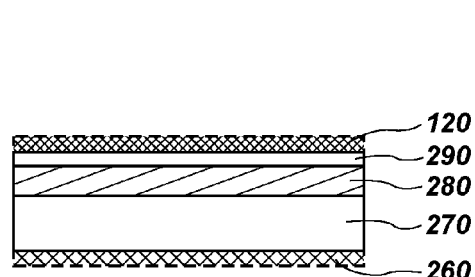
FIG. 2C is an enlarged view of box 2C of FIG. 2, according to an alternate embodiment of the present disclosure, wherein a trap region is spaced from a magnetic region by an intermediate region.

With respect to FIG. 2C, in this or in any other magnetic cell structure embodiment disclosed herein, the trap region 280 may be spaced from a neighboring magnetic region (e.g., the free region 120) by one or more intermediate regions 290. Such intermediate region 290 may be formulated and configured to allow diffusion of the diffusive species from the magnetic region (e.g., the free region 120) to the trap region 280.

Figure 3:
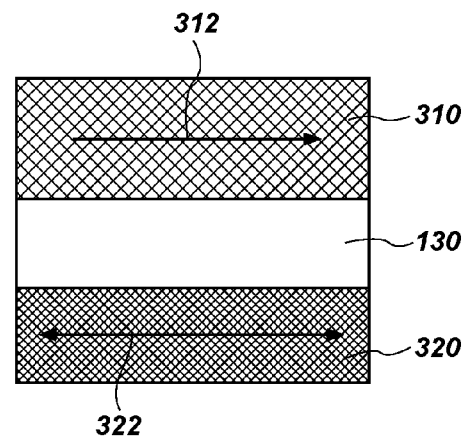
FIG. 3 is a cross-sectional, elevational, schematic illustration of a section of a magnetic cell structure according to an embodiment of the present disclosure, wherein a free region and a fixed region exhibit in-plane magnetic orientations.

The memory cells of embodiments of the present disclosure may be configured as out-of-plane STT-MRAM cells, as in FIGS. 1 and 2, or as in-plane STT-MRAM cells, as illustrated in FIG. 3. "In-plane" STT-MRAM cells include magnetic regions exhibiting a magnetic orientation that is predominantly oriented in a horizontal direction, while "out-of-plane" STT-MRAM cells, include magnetic regions exhibiting a magnetic orientation that is predominantly oriented in a vertical direction. For example, as illustrated in FIG. 1, the STT-MRAM cell may be configured to exhibit a vertical magnetic orientation in at least one of the magnetic regions (e.g., the fixed region 110 and the free region 120). The vertical magnetic orientation exhibited may be characterized by perpendicular magnetic anisotropy ("PMA") strength. As indicated in FIG. 1 by arrows 112 and double-pointed arrows 122, in some embodiments, each of the fixed region 110 and the free region 120 may exhibit a vertical magnetic orientation. The magnetic orientation of the fixed region 110 may remain directed in essentially the same direction throughout operation of the STT-MRAM cell, for example, in the direction indicated by arrows 112 of FIG. 1. The magnetic orientation of the free region 120, on the other hand, may be switched, during operation of the cell, between a parallel configuration and an anti-parallel configuration, as indicated by double-pointed arrows 122 of FIG. 1. As another example, as illustrated in FIG. 3, an in-plane STT-MRAM cell may be configured to exhibit a horizontal magnetic orientation in at least one of the magnetic regions (e.g., a fixed region 310 and a free region 320), as indicated by arrow 312 in the fixed region 310 and double-pointed arrow 322 in the free region 320. Though FIG. 3 illustrates only the fixed region 310, the intermediate oxide region 130, and the free region 320, overlying regions may be those overlying the fixed region 110 of FIGS. 1 and 2 and underlying regions may be those underlying the free region 120 in FIGS. 1 and 2.

Figure 4A:
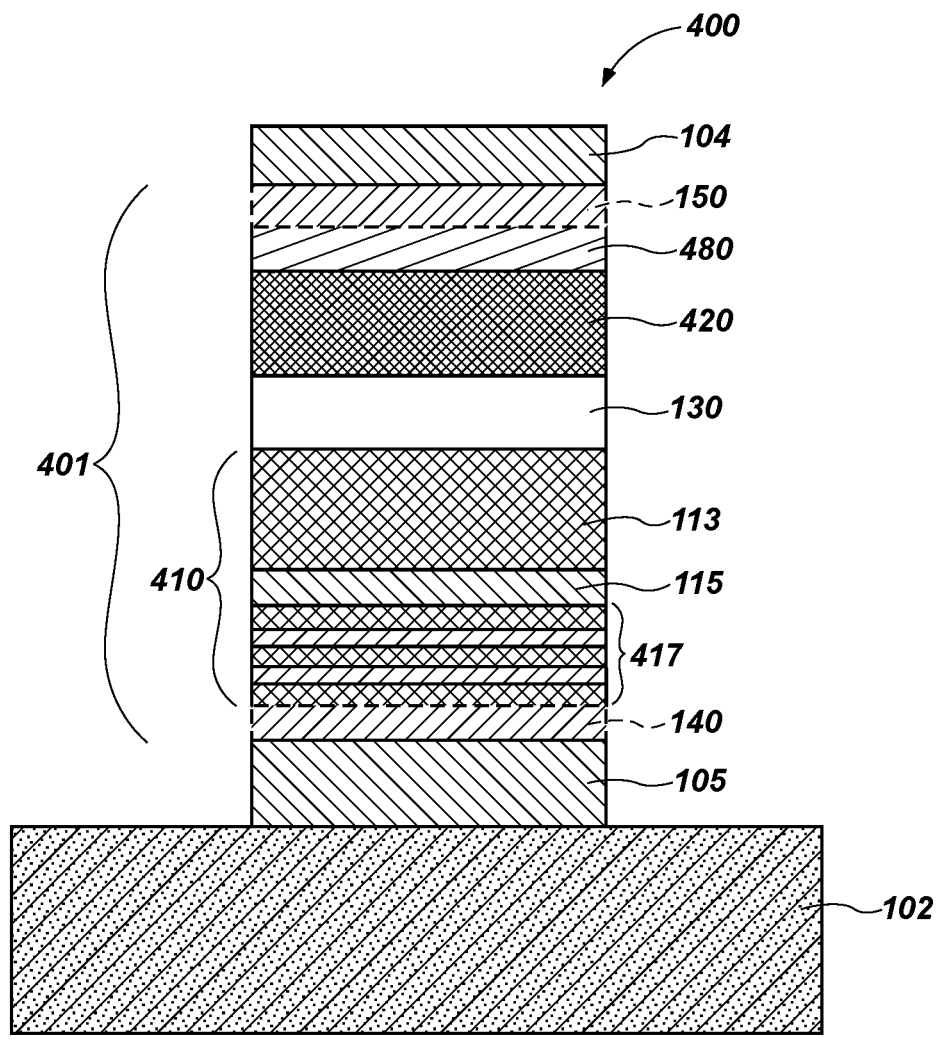
FIG. 4A is a cross-sectional, elevational, schematic illustration of a magnetic cell structure according to an embodiment of the present disclosure, wherein the magnetic cell structure includes a fixed region underlying a free region, a single oxide region proximate to the free region, and a trap region also proximate to the free region.
Figure 4B:
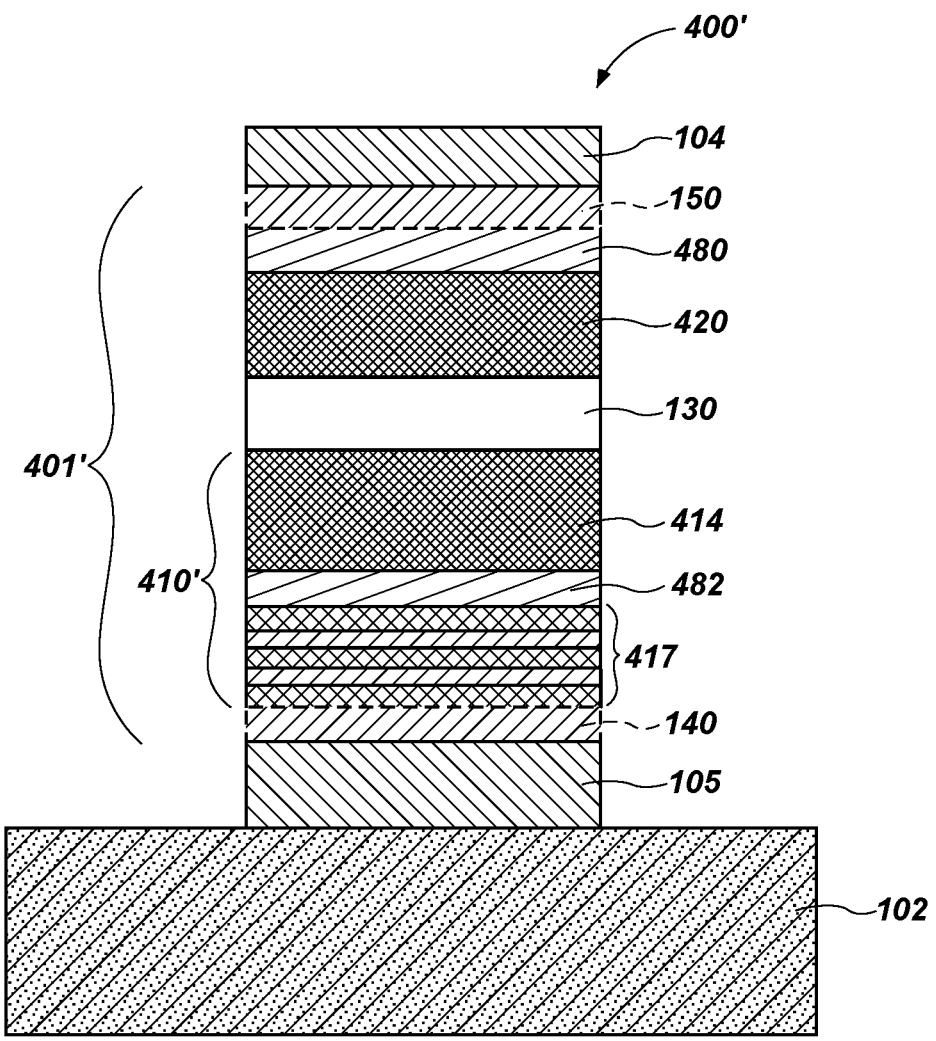
FIG. 4B is a cross-sectional, elevational, schematic illustration of a magnetic cell structure according to an embodiment of the present disclosure, wherein the magnetic cell structure includes a fixed region underlying a free region, a single oxide region proximate to the free region, a trap region also proximate to the free region, and another trap region proximate to the fixed region.
Figure 5:
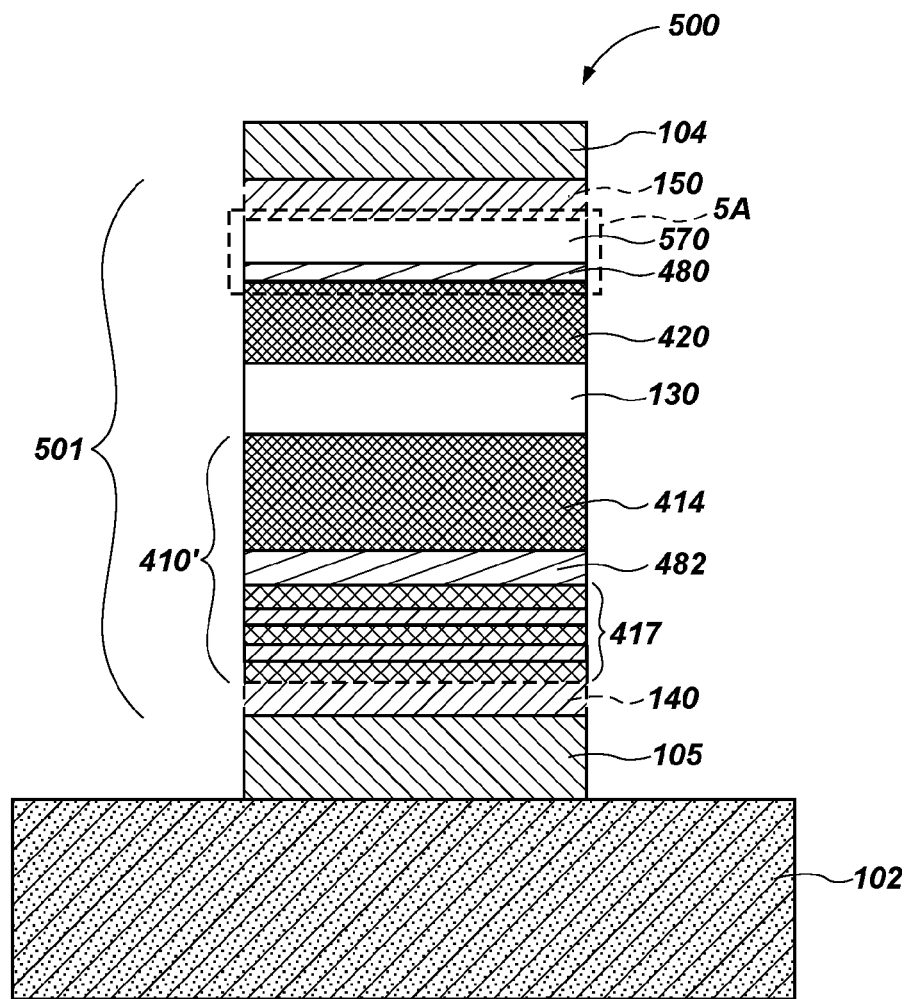
FIG. 5 is a cross-sectional, elevational, schematic illustration of a magnetic cell structure according to an embodiment of the present disclosure, wherein the magnetic cell structure includes a fixed region underlying a free region, dual oxide regions, a trap region proximate to one of the dual oxide regions and also proximate to the free region, and another trap region proximate to the fixed region.

Though in some embodiments, such as that of FIGS. 1 and 2, the fixed region 110 may overlay the free region 120, in other embodiments, such as that of FIGS. 4A, 4B, and 5, the fixed region 110 may underlay the free region 120. For example, and without limitation, in FIG. 4A, illustrated is a magnetic cell structure 400 having a magnetic cell core 401 in which a fixed region 410 overlays the lower electrode 105 and, if present, the lower intermediary regions 140. The foundation region 260 (FIG. 2) (not illustrated in FIG. 4A) may, optionally, be included between, e.g., the lower electrode 105 (or the lower intermediary regions 140, if present) and the fixed region 410. The fixed region 410 may, for example and without limitation, be configured as a multi-sub-region fixed region 410, with an electrode-adjacent portion 417 that may be configured as an alternating structure as in the electrode-adjacent portion 117 of FIGS. 1A and 1B. The oxide-adjacent portion 113 of, e.g., a homogeneous magnetic material, may overlay the electrode-adjacent portion 417. A sub-region, such as the intermediate portion 115 of FIG. 1A, may be disposed between the electrode-adjacent portion 417 and the oxide-adjacent portion 113. The intermediate oxide region 130 may overlay the fixed region 410, and a free region 420 may overlay the intermediate oxide region 130.

A trap region 480 may be proximate to at least one of the fixed region 410 and the free region 420. For example, as illustrated in FIG. 4A, the trap region 480 may overlay the free region 420. In other embodiments (not illustrated in FIG. 4A), the trap region 480 or another trap region may alternatively or additionally underlay the free region 420 or be disposed internal to the free region 420.

Regardless, the trap region 480 is formed from a precursor trap material, proximate to a precursor magnetic material (e.g., from which the free region 420 is to be formed). The precursor trap material includes at least one attracter species, with trap sites, formulated and structured to attract and react with a diffused species from the precursor magnetic material to promote crystallization of the depleted magnetic material into a desired crystal structure that enables high TMR.

The upper electrode 104 and, if present, the upper intermediary regions 150 may overlay the trap region 480 and the free region 420. Thus, the magnetic cell structure 400 is configured as a "bottom-pinned" memory cell with a single MA-inducing oxide region (e.g., the intermediate oxide region 130).

With reference to FIG. 4B, an alternate embodiment of a magnetic cell structure 400', configured as a bottom-pinned memory cell with a single MA-inducing oxide region, may include substantially the same structure as the magnetic cell structure 400 of FIG. 4A, but with a fixed region 410' of a magnetic cell core 401' that includes another trap region 482 instead of the intermediate portion 115 of the fixed region 410 of FIG. 4A. Therefore, the magnetic cell core 401' may also include a depleted oxide-adjacent portion 414 instead of the non-depleted, oxide-adjacent portion 113 of FIG. 4A.

With reference to FIG. 5, illustrated is a magnetic cell structure 500 also configured as a bottom-pinned memory cell. The illustrated memory cell structure 500 includes a magnetic cell core 501 having dual oxide regions, e.g., the intermediate oxide region 130 and a secondary oxide region 570. The secondary oxide region 570 may be beneath the upper electrode 104 and over both of the free region 420 and the trap region 480.

Figure 5A:
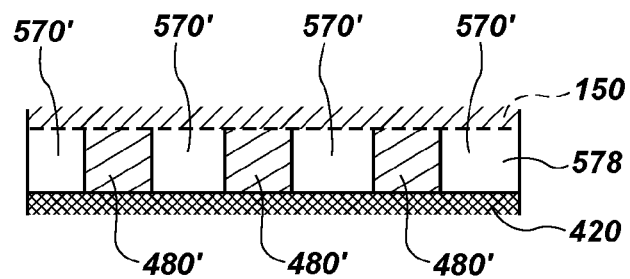
FIG. 5A is an enlarged view of box 5A of FIG. 5, according to an alternate embodiment of the present disclosure, wherein discrete trap sub-regions alternate with discrete secondary oxide sub-regions.

In this, or in any other embodiment described herein, the trap region 480 may be incorporated with the secondary oxide region 570, e.g., as one or more sub-regions of the secondary oxide region 570. Such a trap-and-oxide-incorporated region may be referred to herein as a "trap oxide region." For example, as illustrated in FIG. 5A, a trap oxide region 578 may include discrete trap sub-regions 480' interdisposed with discrete secondary oxide regions 570'. The discrete trap sub-regions 480' may nonetheless be formed from precursor trap material having attracter species with trap sites to which the diffused species, having diffused from the precursor magnetic material, may bond.

The trap region (e.g., the trap region 180 (FIG. 1)) of any of the embodiments disclosed herein may be substantially continuous (i.e., without gaps in the material of the region). In other embodiments, however, a trap region, according to any of the embodiments disclosed herein, may be discontinuous (i.e., may have gaps between the material of the region).

In any of the embodiments described herein, the relative dispositions of the fixed region 110 (FIGS. 1 and 2), 110' (FIG. 1A), 110" (FIG. 1B), 310 (FIG. 3), 410 (FIG. 4A), 410' (FIGS. 4B and 5), the intermediate oxide region 130 (FIGS. 1 through 2 and 3 through 5), the free region 120 (FIGS. 1 and 2), 320 (FIG. 3), 420 (FIGS. 4A, 4B, and 5), the trap region or regions 180 (FIG. 1), 182 (FIG. 1B), 280 (FIG. 2), 480 (FIGS. 4A, 4B, and 5), 482 (FIGS. 4B and 5), the secondary oxide region 270 (FIG. 2), 570 (FIG. 5) (if present), the trap oxide region 578 (FIG. 5A) (if present), and any sub-regions (if present) may be respectively reversed. Even if reversed, the intermediate oxide region 130 is disposed between the free region 120 (FIGS. 1 and 2), 320 (FIG. 3), 420 (FIGS. 4A, 4B, and 5) and the fixed region 110 (FIGS. 1 and 2), 110' (FIG. 1A), 110" (FIG. 1B), 310 (FIG. 3), 410 (FIG. 4A), 410' (FIGS. 4B and 5) with at least one trap region (e.g., the trap region 180 (FIG. 1), the another trap region 182 (FIG. 1B), the trap region 280 (FIG. 2), the trap region 480 (FIGS. 4A, 4B, and 5), the another trap region 482 (FIGS. 4B and 5), the trap oxide region 578

(FIG. 5A)) proximate to precursor magnetic material of at least one of the magnetic regions (e.g., at least one of the free region 120 (FIGS. 1 and 2), 320 (FIG. 3), 420 (FIGS. 4A, 4B, and 5) and the fixed region 110 (FIGS. 1 and 2), 110' (FIG. 1A), 110" (FIG. 1B), 310 (FIG. 3), 410 (FIG. 4A), 410' (FIGS. 4B and 5)).

In other embodiments (not illustrated), a trap region may include a portion that is laterally-adjacent to a magnetic region (e.g., the free region 120). The laterally-adjacent portion may be in addition to, or an alternative to, a vertically-adjacent portion.

Accordingly, disclosed is a memory cell comprising a magnetic cell core. The magnetic cell core comprises a magnetic region comprising a depleted magnetic material formed from a precursor magnetic material comprising at least one diffusive species and at least one other species. The depleted magnetic material comprises the at least one other species. The magnetic cell core also comprises another magnetic region and an oxide region between the magnetic region and the another magnetic region. An amorphous region is proximate to the magnetic region. The amorphous region is formed from a precursor trap material comprising at least one attracter species that has at least one trap site and a chemical affinity for the at least one diffusive species that is higher than a chemical affinity of the at least one other species for the at least one diffusive species. The amorphous region comprises the at least one attracter species bonded to the at least one diffusive species from the precursor magnetic material.

Figure 6:
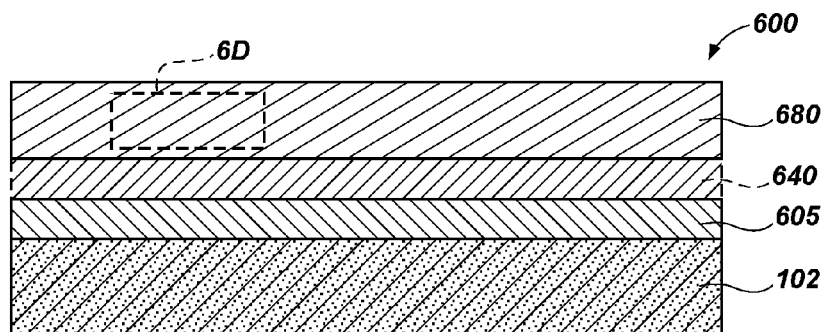

With reference to FIGS. 6 through 9C, illustrated are stages in a method of fabricating magnetic cell structures, such as the magnetic cell structure 100 of FIG. 1, and according to the embodiments of FIGS. 1A, and 1B. As illustrated in FIG. 6, an intermediate structure 600 may be formed with a conductive material 605 formed over the substrate 102, and a precursor trap material 680 over the conductive material 605. Optionally, one or more lower intermediary materials 640 may be formed over the conductive material 605, before forming the precursor trap material 680 thereover.

In other embodiments, such as may be utilized to form the magnetic cell structure 200 of FIG. 2, or another structure comprising a base secondary oxide region (e.g., the secondary oxide region 270 (FIG. 2), a foundation material (not shown) may be formed over the conductive material 605 and the lower intermediary materials 640, if present. An oxide material (not shown) may be formed over the foundation material, before forming the precursor trap material 680 thereover.

The conductive material 605, from which the lower electrode 105 (FIGS. 1, 2, 4A, 4B, and 5) is formed, may comprise, consist essentially of, or consist of, for example and without limitation, a metal (e.g., copper, tungsten, titanium, tantalum), a metal alloy, or a combination thereof.

In embodiments in which the optional lower intermediary region 140 (FIGS. 1, 2, 4A, 4B, and 5) is formed over the lower electrode 105, the lower intermediary material 640, from which the lower intermediary region 140 is formed, may comprise, consist essentially of, or consist of, for example and without limitation, tantalum (Ta), titanium (Ti), tantalum nitride (TaN), titanium nitride (TiN), ruthenium (Ru), tungsten (W), or a combination thereof. In some embodiments, the lower intermediary material 640, if included, may be incorporated with the conductive material 605 from which the lower electrode 105 (FIGS. 1, 2, 4A, 4B, and 5) is to be formed. For example, the lower intermediary material 640 may be an upper-most sub-region of the conductive material 605.

In embodiments in which a foundation material is formed over the conductive material, as if forming the magnetic cell structure 200 of FIG. 2, the foundation material may comprise, consist essentially of, or consist of, for example and without limitation, a material comprising at least one of cobalt (Co) and iron (Fe) (e.g., a CoFeB material), a material comprising a nonmagnetic material (e.g., a nonmagnetic conductive material (e.g., a nickel-based material)), or a combination thereof. The foundation material may be formulated and configured to provide a template that enables forming a material (e.g., an oxide material) thereover at a desired crystal structure (e.g., a bcc (001) crystal structure).

Also in embodiments to form the magnetic cell structure 200 of FIG. 2, the oxide material, from which the secondary oxide region 270 (FIG. 2) is to be formed, may comprise, consist essentially of, or consist of, for example and without limitation, a nonmagnetic oxide material (e.g., magnesium oxide (MgO), aluminum oxide ($Al_2O_3$), titanium oxide ($TiO_2$), or other oxide materials of conventional MTJ regions). The oxide material may be formed (e.g., grown, deposited) directly on the foundation material, if present. In embodiments in which the foundation material is amorphous when initially formed, the resulting oxide material may be crystalline (e.g., have a bcc (001) crystal structure) when initially formed over the foundation material.

The precursor trap material 680, may be formed by, for example and without limitation, sputtering at least one attracter species over the previously-formed materials. The precursor trap material 680 is formulated (i.e., the at least one attracter species is selected) to have a higher chemical affinity for a diffusive species from a precursor magnetic material, to be formed adjacent the precursor trap material 680, compared to a chemical affinity between the diffusive species and another species of the precursor magnetic material. Therefore, the precursor trap material 680 is formulated to attract the diffusive species from the precursor magnetic material.

In some embodiments, each species of the precursor trap material 680 may be formulated to have a chemical affinity for (i.e., be compatible to chemically bond with) the diffused species from the precursor magnetic material. In other embodiments, fewer than all of the species of the precursor trap material 680 may be formulated to have the desired chemical affinity for the diffusive species. Therefore, the precursor trap material 680 may include species non-reactive with the diffused species or may consist of or consist essentially of species that react with the diffused species.

Figure 6A:
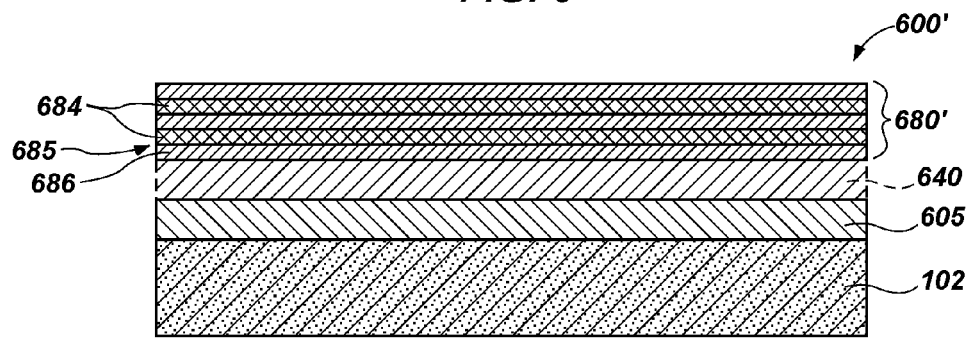
FIG. 6A is a cross-sectional, elevational, schematic illustration of the structure of FIG. 6, with the precursor trap material illustrated in further detail, according to an embodiment of the present disclosure, wherein the precursor trap material is formed to have a structure of alternating attracter species.
Figure 6B:
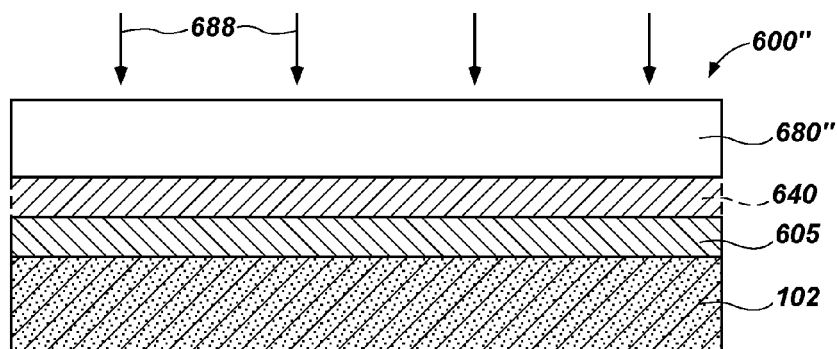
FIG. 6B is a cross-sectional, elevational, schematic illustration of a stage of processing preceding that of FIG. 6, wherein an attracter material is bombarded to form the precursor trap material of FIG. 6.
Figure 6C:
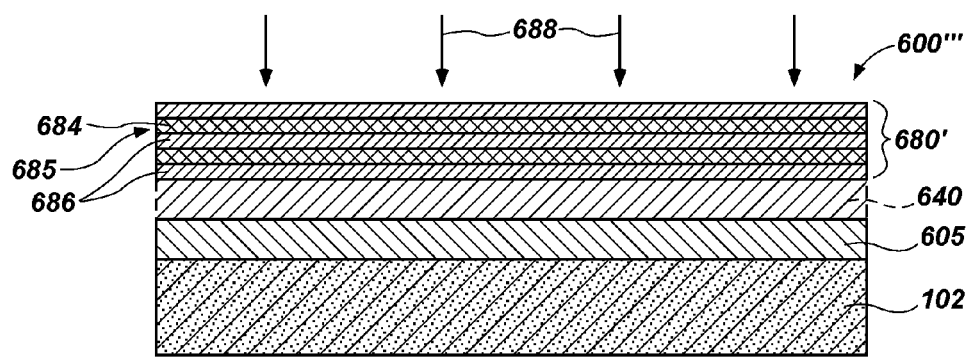
FIG. 6C is a cross-sectional, elevational, schematic illustration of a stage of processing preceding that of FIG. 6 and following that of FIG. 6A, wherein the structure of alternating attracter species is bombarded to form the precursor trap material of FIG. 6.
Figure 6D:
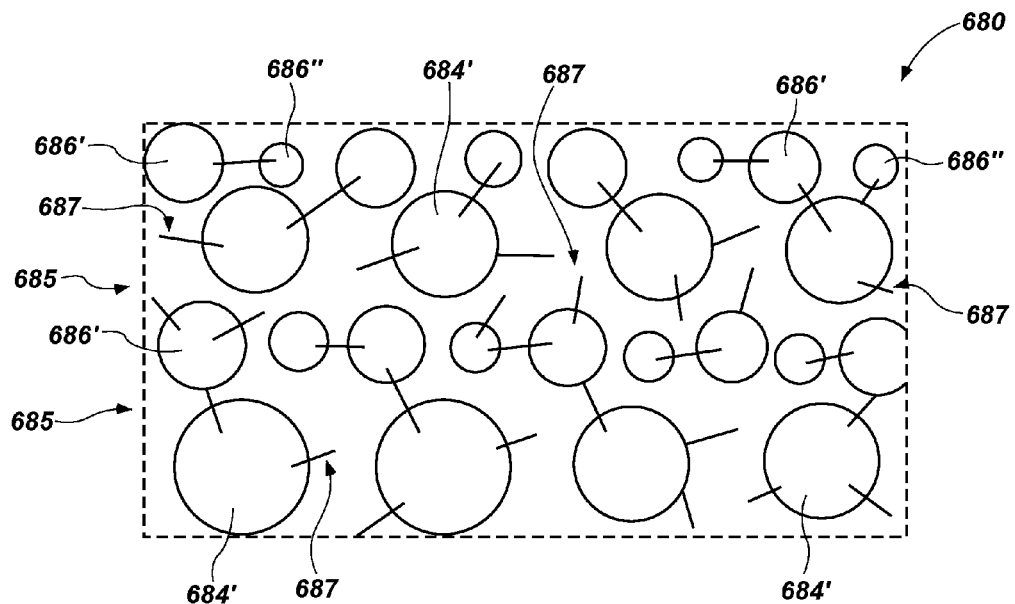
FIG. 6D is an enlarged view of box 6D of FIG. 6, according to the embodiment of FIG. 6A or 6C, with a simplified illustration of trap sites of the precursor trap material of FIG. 6.
Figure 6E:
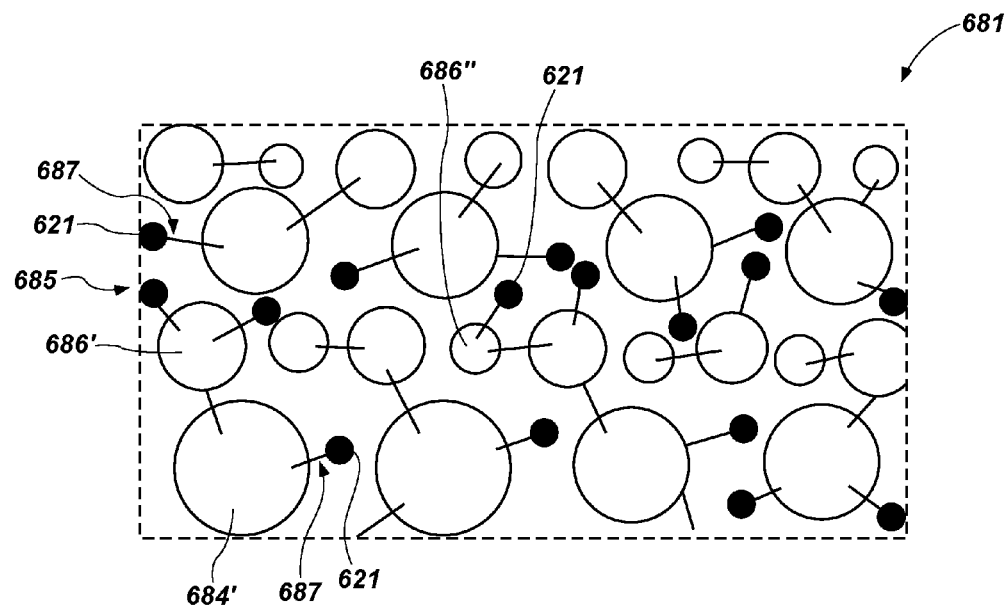
FIG. 6E is an enlarged view of box 6D of FIG. 6 during a stage of processing subsequent to that of FIG. 6D, wherein a diffused species has reacted with the trap sites of FIG. 6D to form an enriched intermediate trap material.
Figure 6F:
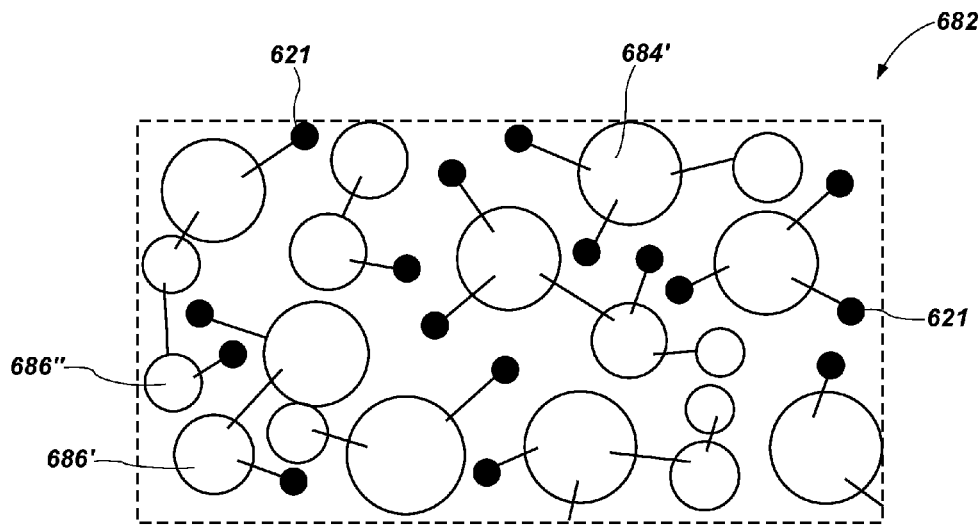
FIG. 6F is an enlarged view of box 6D of FIG. 6 during a stage of processing subsequent to that of FIG. 6E, wherein the attracter species and the diffused species in the enriched intermediate trap material of FIG. 6E have intermixed to form an amorphous trap material.

With reference to FIGS. 6 through 6F, the precursor trap material 680 is structured and formulated to provide at least one trap site 687 (FIG. 6D) of at least one attracter species 684, 686 (FIGS. 6A and 6C through 6F). The trap sites 687 (FIG. 6D) enable the diffusive species, once diffused from the precursor magnetic material, to bond with at least one of the at least one attracter species 684, 686 so that the diffused species may be retained in what is referred to herein as an "enriched precursor trap material" 681 (FIG. 6E).

Structuring the precursor trap material 680 to include the trap sites 687 (FIG. 6D) may include forming the precursor trap material 680 with a structure of mismatched crystal lattices between neighboring sub-regions of the attracter species 684, 686. As used herein, the term "mismatched crystal lattices" refers to crystal lattice structures of neighboring species that are not in alignment with one another such that 1:1 bonding between the species, to completely saturate the species, is not readily achievable. For example, with reference to FIGS. 6A and 6D, a plurality of attracter species 684, 686 may be formed, one over the other, to form an alternating structure with interfaces 685 formed where two of the attracter species 684, 686 adjoin one another. With reference to FIG. 6D, such a mismatched crystal lattice structure may leave trap sites 687 on atoms 684', 686', 686" of the attracter species 684, 686. The trap sites 687 may particularly occupy the interfaces 685 between species due, at least in part, to the mismatch between crystal lattice structures of the attracter species 684, 686.

Without being limited to any particular theory, it is contemplated that the greater the number of interfaces 685, and, thus, the greater the number of alternating sub-regions of the attracter species 684, 686, the greater the number of trap sites 687 that may be included in the precursor trap material 680. The thickness of each individual sub-region may be minimal (e.g., approximately one atom thick or several atoms thick), with the total thickness of such an intermediate structure 600' tailored to provide a maximum number of trap sites 687 (i.e., potential bonding sites for the diffused species, during subsequent processing acts) without degrading other characteristics (e.g., electrical resistivity) of the cell to be formed.

In some embodiments, the precursor trap material 680 may include a transition metal (e.g., tungsten (W), hafnium (Hf), molybdenum (Mo), and zirconium (Zr)) as at least one of the attracter species 684, 686 (e.g., attracter species 684 of FIGS. 6A and 6C through 6F) and at least one of iron (Fe), cobalt (Co), ruthenium (Ru), and nickel (Ni) as at least one other of the attracter chemicals (e.g., attracter species 686 of FIGS. 6A and 6C through 6F).

In one particular example, without limitation, the precursor trap material 680 may comprise, consist essentially of, or consist of cobalt and iron as one type of attracter species (e.g., the attracter species 686) and tungsten (W) as another attracter species (e.g., the attracter species 684). Each of the cobalt-iron and tungsten may have a chemical affinity for a diffusive species, such as boron (B), of a neighboring precursor magnetic material formulated as a CoFeB magnetic material. At least the chemical affinity of the tungsten for the boron may be greater than a chemical affinity between the boron and the other species of the precursor magnetic material (e.g., cobalt and iron).

In another particular example, without limitation, the precursor trap material 680 may comprise, consist essentially of, or consist of ruthenium (Ru) as one attracter species and tungsten (W) as another attracter species. Again, each of the ruthenium and the tungsten may have a chemical affinity for the diffusive species (e.g., boron (B)).

With reference to FIG. 6B, another method for structuring the precursor trap material 680 to include the trap sites 687 (FIG. 6D) is to form, over the substrate 102, an attracter material 680", which may not necessarily be unsaturated when initially formed, and then bombard the attracter material 680" with, e.g., one or more ions or radicals from plasma as bombarding species, to induce point defects, frustrated bonds, under-coordinated sites, or dangling bonds (i.e., trap sites) in the microstructure of the attracter material 680". For example, bombarding species such as argon (Ar), nitrogen (N), helium (He), xenon (Xe) may be driven into the attracter material 680" of intermediate structure 600", as indicated by arrows 688, to break occupied bonds and create the trap sites 687 (FIG. 6D). In such embodiments, the bombarding species may be retained in the precursor trap material 680 (FIGS. 6 and 6D).

With reference to FIG. 6C, a combination of techniques may be utilized to structure the precursor trap material 680 to include the trap sites 687 (FIG. 6D). For example, the intermediate structure 600' of FIG. 6A, with the mismatched crystal lattice structure, may be subjected to the bombardment 688 process of FIG. 6B. A bombarded mismatched crystal lattice intermediate structure 600''' may include more trap sites 687 (FIG. 6D) than may result from the techniques of FIGS. 6A and 6B alone.

During subsequent processing, such as during an anneal stage, a diffusive species 621' (FIG. 7A) may transfer (e.g., diffuse) from a neighboring precursor magnetic material to the precursor trap material 680 during. As this occurs, as illustrated in FIG. 6E, the trap sites 687 (FIG. 6D) may receive and react with the diffused species 621 to form an enriched precursor trap material 681. Atoms of the diffused species 621 may bond to one or more of the atoms 684', 686', 686" of the attracter species 684, 686 (see FIG. 6E).

In some embodiments, such as that of FIG. 6A and FIG. 6C and, optionally, also FIG. 6B, the precursor trap material 680 may be crystalline when initially formed over the substrate 102. The precursor trap material 680 may remain crystalline, at least initially, as the diffused species 621 begins to diffuse into and react with the trap sites 687 (FIG. 6D). However, as the composition of enriched precursor trap material 681 changes, i.e., as more of the diffused species 621 becomes trapped by the trap sites 687 (FIG. 6D), and as the high temperatures of the anneal encourage material movement, the species (e.g., the diffused species 621 and the attracter species 684, 686) of the enriched precursor trap material 681 may intermix and convert the enriched precursor trap material 681 into an amorphous trap material 682 (also referred to herein as an "enriched trap material 682" and an "enriched amorphous trap material 682"), as illustrated in FIG. 6F.

Figure 6G:
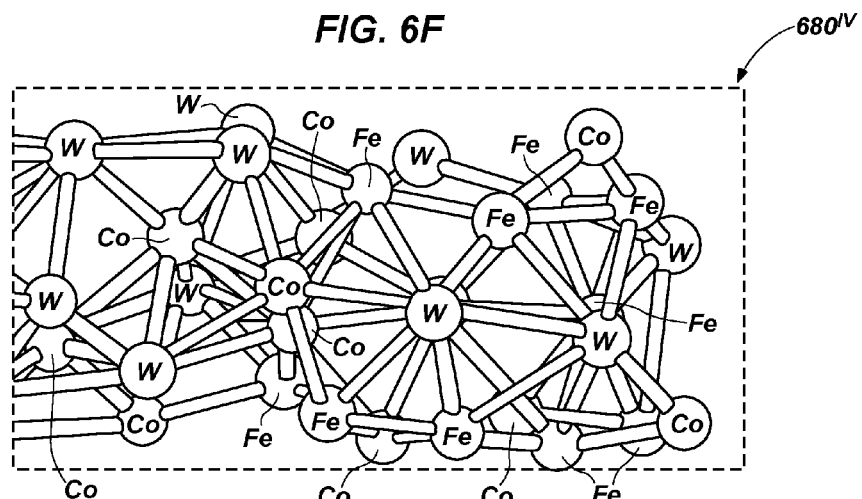
FIG. 6G is an enlarged view of box 6D, during the stage of processing of FIG. 6, according to an embodiment in which the precursor trap material comprises cobalt (Co), iron (Fe), and tungsten (W)
Figure 6H:
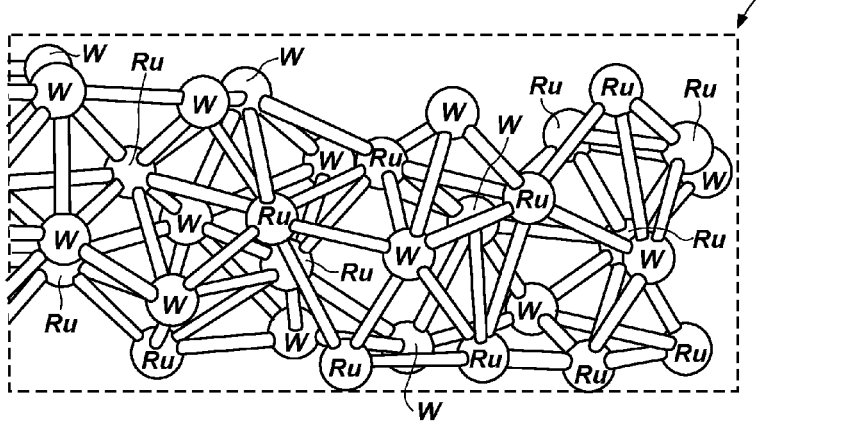
FIG. 6H is an enlarged view of box 6D, during the stage of processing of FIG. 6, according to another embodiment in which the precursor trap material comprises ruthenium (Ru) and tungsten (W)

In other embodiments, such as those of FIGS. 6G and 6H, the precursor trap material 680 (FIG. 6) may be formulated to be amorphous when initially formed over the substrate 102 and to remain amorphous throughout, e.g., an anneal. For example, with reference to FIG. 6G, a precursor trap material $680^{IV}$ may comprise, consist essentially of, or consist of iron (Fe), cobalt (Co), and tungsten (W) and may be amorphous when initially formed over the substrate 102 (FIG. 6). At least one of the atoms of the Fe, Co, and W may be under-coordinated, frustrated, or have dangling bonds or point defects such that the atoms include trap sites 687 (see FIG. 6D) (not illustrated in FIG. 6G). As another example, with reference to FIG. 6H, a precursor trap material $680^{V}$ may comprise, consist essentially of, or consist of ruthenium (Ru) and tungsten (W) and may be amorphous when initially formed over the substrate 102 (FIG. 6). At least one of the atoms of the Ru and W may be under-coordinated, frustrated, or having dangling bonds or point defects such that the atoms include trap sites 687 (see FIG. 6D) (not illustrated in FIG. 6H). In either such embodiment, the trap sites 687 (see FIG. 6D) may not be aligned along defined interfaces, but, rather, may be distributed throughout the precursor trap material $680^{IV}$ (FIG. 6G), $680^{V}$ (FIG. 6H). Moreover, the enriched precursor trap material 681 may also be amorphous. In such embodiments, the atomic ratios of the species of the precursor trap material $680^{IV}$ (FIG. 6G), $680^{V}$ (FIG. 6H) may be selected to enable the precursor trap material $680^{IV}$ (FIG. 6G), $680^{V}$ (FIG. 6H) to be amorphous and remain amorphous even at high anneal temperatures (e.g., greater than about 500° C.).

In any case, the atomic ratios of the attracter species 684, 686 in the precursor trap material 680 may be selected to tailor the atomic ratios in the final, enriched trap material 682 to a composition that will be amorphous and remain amorphous at high anneal temperatures. For example, in embodiments in which the precursor trap material 680 comprises, consists essentially of, or consists of iron (Fe), cobalt (Co), and tungsten (W) and in which boron (B) is the diffusive species 621, the composition of the precursor trap material 680 may be selected so that the composition of the enriched trap material 682, including the diffused species 621 and, optionally, bombarding species, comprises at least about 35 at. % tungsten (W), which may remain amorphous up to temperatures of about 700° C.

Moreover, the precursor trap material 680 may be formulated such that the precursor trap material 680 is stable (e.g., species will not out-diffuse) at high temperatures used during anneal for crystallizing the depleted magnetic material. Therefore, the high temperatures that promote crystallization of the depleted magnetic material, derived from a precursor magnetic material, to a desired crystal structure (e.g., a bcc (001) structure) may be utilized without the precursor trap material 680 inhibiting the crystallization. Without being limited to any one theory, it is contemplated that the amorphous nature of the enriched trap material 682 avoids microstructure defects in the depleted magnetic material that may otherwise form if the enriched trap material 682 had a microstructure that differed from and competed with that of the desired crystal structure (e.g., the bcc (001) structure) as the crystal structure propagated to the depleted magnetic material from a neighboring material.

Accordingly, disclosed is a semiconductor structure comprising a magnetic region over a substrate. The magnetic region comprises a precursor magnetic material comprising a diffusive species. A trap region comprises at least one attracter species, which comprises at least one trap site. The at least one attracter species is formulated to exhibit a higher chemical affinity for the diffusive species of the magnetic precursor material than a chemical affinity between the diffusive species and another species of the precursor magnetic material.

Figure 7:
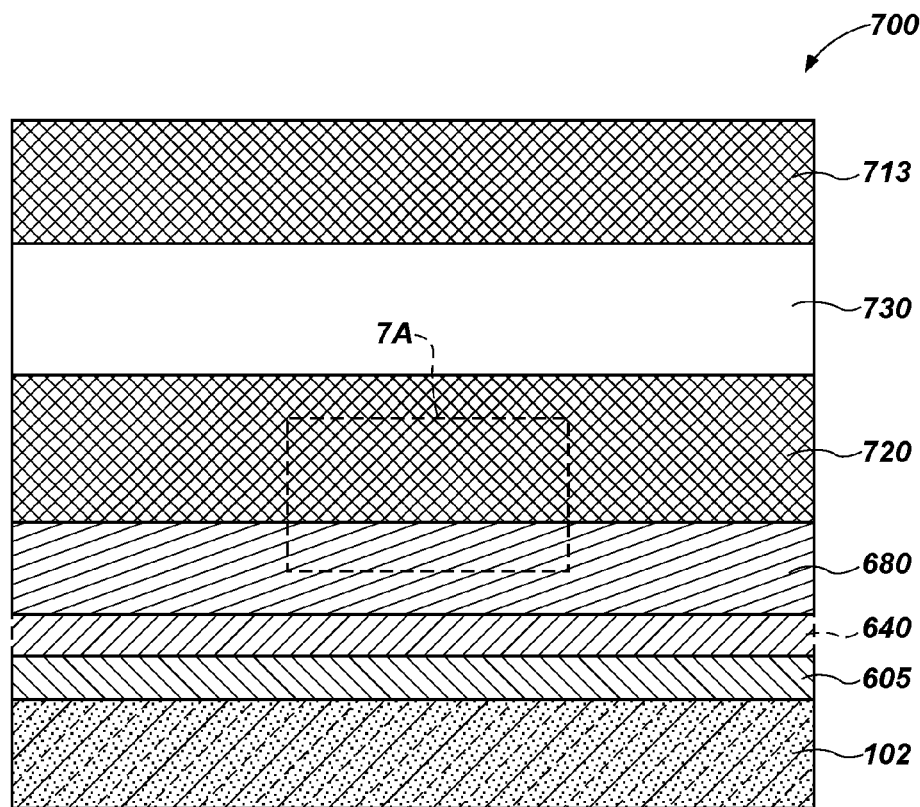

With reference to FIG. 7, after the precursor trap material 680 of FIG. 6 has been formed, and before diffusion of the diffusive species 621' to react with the trap sites 687 (FIGS. 6D and 6E), at least one precursor magnetic material 720 may be formed over the precursor trap material 680, as illustrated in FIG. 7. The precursor magnetic material 720, from which the free region 120 (FIG. 1) is eventually formed, may comprise, consist essentially of, or consist of, for example and without limitation, a ferromagnetic material including cobalt (Co) and iron (Fe) (e.g. $Co_xFe_y$, wherein x=10 to 80 and y=10 to 80) and, in some embodiments, also boron (B) (e.g., $Co_xFe_yB_z$, wherein x=10 to 80, y=10 to 80, and z=0 to 50). Thus, the precursor magnetic material 720 may comprise at least one of Co, Fe, and B (e.g., a CoFeB material, a FeB material, a CoB material). In other embodiments, the precursor magnetic material 720 may alternatively or additionally include nickel (Ni) (e.g., an NiB material). In some embodiments, the precursor magnetic material 720 may comprise the same material as the foundation material, if included over the conductive material 605 on the substrate 102, or a material having the same elements as the foundation material, though with different atomic ratios of those elements. The precursor magnetic material 720 may be formed as a homogeneous region. In other embodiments, the precursor magnetic material 720 may include one or more sub-regions, e.g., of CoFeB material, with the sub-regions having different relative atomic ratios of Co, Fe, and B.

Figure 7A:
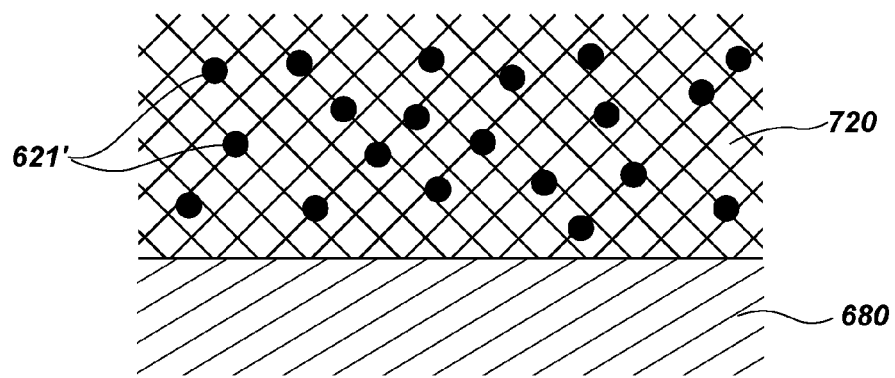
FIG. 7A is an enlarged view of box 7A of FIG. 7, with a simplified illustration of a diffusive species in a precursor magnetic material adjacent to the precursor trap material of FIG. 6 and FIG. 6D.

With reference to FIG. 7A, the precursor magnetic material 720 includes at least one diffusive species 621' and at least one other species. The presence of the diffusive species 621' is not necessary for the precursor magnetic material 720, or a depleted magnetic material formed therefrom, to exhibit magnetism. However, the presence of the diffusive species 621' in the precursor magnetic material 720 may enable the precursor magnetic material 720 to be formed (e.g., by sputtering) in an amorphous state.

Figure 8:
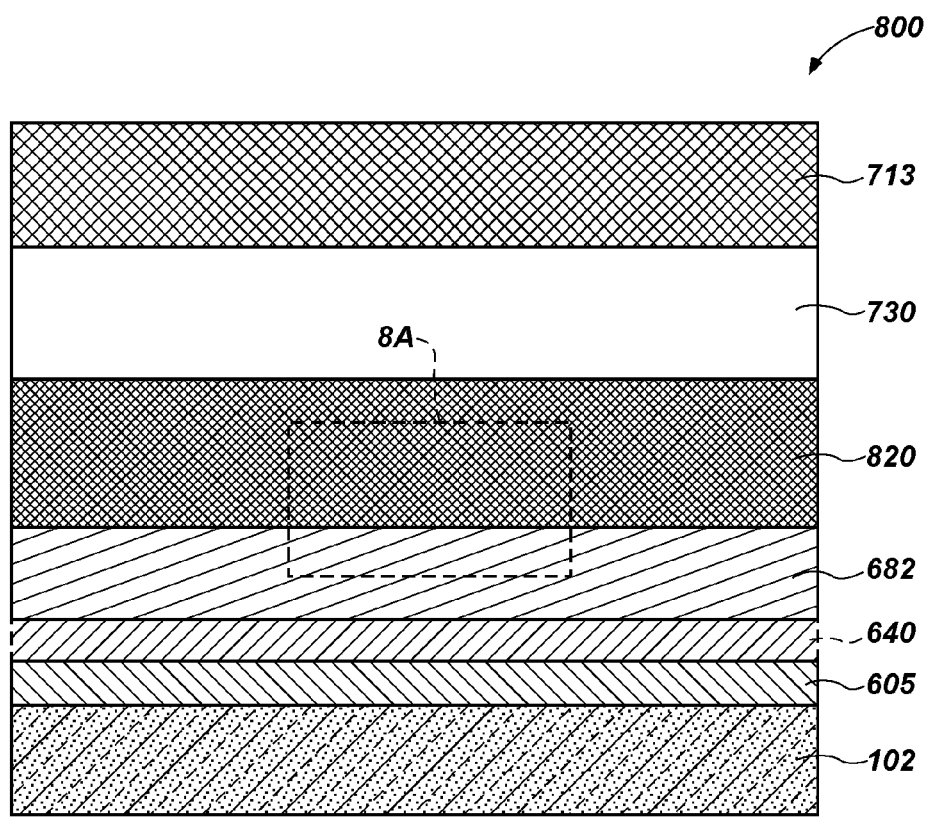
Figure 8A:
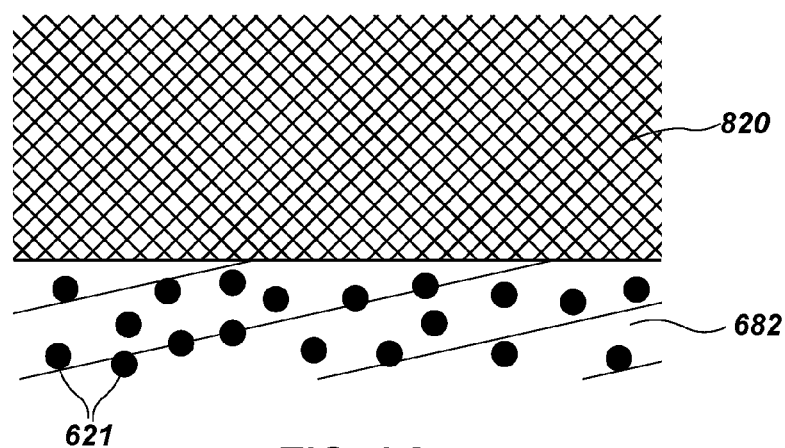
FIG. 8A is an enlarged view of box 8A of FIG. 8, with a simplified illustration of the diffusive species from the precursor magnetic material of FIG. 7A, now as the diffused species in the amorphous trap material of FIG. 6F.

The proximity of the precursor trap material 680 to the precursor magnetic material 720 and the precursor trap material's 680 higher chemical affinity for the diffusive species 621' (FIG. 7A) compared to the other species of the precursor magnetic material 720, may enable removal of the diffusive species 621' (FIG. 7A) from the precursor magnetic material 720. With reference to FIGS. 8 and 8A, the removal forms a depleted magnetic material 820 and the enriched trap material 682, as illustrated in FIG. 8. For example, and with reference to FIG. 8B, the diffusive species 621' (FIG. 7A) may diffuse into the precursor trap material 680 where the diffused species 621 may chemically bond to the attracter species 684, 686 of the precursor trap material 680. This removal of the diffused species 621 from the precursor magnetic material 720 by the precursor trap material 680 may occur during an anneal of an intermediate structure 700 (FIG. 7) to form an annealed intermediate structure 800, as illustrated in FIG. 8.

In the annealed intermediate structure 800, the depleted magnetic material 820 has a lower concentration of the diffused species 621 (FIG. 8A), while the enriched trap material 682 includes the diffused species 621, as illustrated in FIG. 8A. The magnetic cell structures 100 (FIG. 1), 200 (FIG. 2), 400 (FIG. 4A), 400' (FIG. 4B), and 500 (FIG. 5) may thus include the depleted magnetic material 820 (e.g., in the free region 120 (FIGS. 1 and 2), 320 (FIG. 3), 420 (FIGS. 4A, 4B, and 5); in the oxide-adjacent portion 114 of the fixed region 110" (FIG. 1B); and in the oxide-adjacent portion 414 of the fixed region 410' (FIGS. 4 and 5)) and the diffused-species-including enriched trap material 682 (e.g., in the trap region 180 (FIG. 1), 280 (FIGS. 2 and 2C); 480 (FIGS. 4A, 4B, and 5), in the another trap region 182 (FIG. 1B), 482 (FIGS. 4B and 5); in the discrete trap sub-regions 480' of the trap oxide region 578 (FIG. 5A)).

For example, and without limitation, in embodiments in which the precursor magnetic material 720 (FIG. 7) is a CoFeB material, the depleted magnetic material 820 may be a CoFe material (i.e., a magnetic material comprising cobalt and iron). In such embodiments in which the precursor trap material 680 (FIG. 7) is an alternating structure of sub-regions of a cobalt-iron (CoFe) attracter species and sub-regions of a tungsten (W) attracter species, the enriched trap material 682 may be an amorphous mixture of cobalt, iron, tungsten, and boron (B) (i.e., a CoFeWB mixture or alloy).

Without being restricted to any one theory, it is contemplated that removing the diffusive species 621' (FIG. 7A) of boron from the CoFeB precursor magnetic material 720 with a precursor trap material 680 having trap sites 687 (FIG. 6D) of attracter species having an affinity for boron may enable crystallization of the depleted magnetic material 820 at a lower temperature than the crystallization temperature of the precursor magnetic material 720 (FIG. 7) including the diffusive species 621'. Thus, an anneal temperature used (e.g., greater than about 500° C.) may enable crystallization of the depleted magnetic material 820 (e.g., by propagating the desired crystal structure from a neighboring material, e.g., material of the intermediate oxide region 130 (FIG. 1)) without being so high as to degrade neighboring materials (e.g., without out-diffusing tungsten (W) from the enriched trap material 682). The depleted magnetic material 820 may, therefore, be crystallized into a desired crystal structure (e.g., a bcc (001) crystal structure) that enables formation of a magnetic cell structure (e.g., the magnetic cell structure 100 (FIG. 1), 200 (FIG. 2), 400 (FIG. 4A), 400' (FIG. 4B), 500 (FIG. 5)) without suffering from substantial structural defects. The absence of substantial structural defects may enable a high TMR.

Without being limited to any one theory, it is further contemplated that removal of the diffusive species 621' (FIG. 7A) from the precursor magnetic material 720 (and/or from another precursor magnetic material 713' (FIG. 9B)) may also promote inducement of MA along an interface between the depleted magnetic material 820 and a neighboring oxide material (e.g., the oxide material of the secondary oxide region 270 (FIG. 2) or the intermediate oxide region 130 (FIG. 1)). For example, in the absence of the diffusive species 621' (FIG. 7A), the other species of the depleted magnetic material 820 may have more interaction with the oxide material than the other species would have if the diffusive species 621' were still incorporated in the precursor magnetic material 720. Moreover, the retention of the diffused species 621 (FIG. 8A) via chemical bonds at the once-available trap sites 687 (FIG. 6D) in the enriched trap material 682 may avoid the diffused species 621 from diffusing to the interface (e.g., interface 132 (FIG. 1)) between the magnetic region (e.g., the free region 120) and its neighboring MA-inducing oxide region (e.g., the intermediate oxide region 130 (FIG. 1)). This may enable more MA-inducing interaction along the interface (e.g., interface 132 (FIG. 1)) than may otherwise be achieved. Therefore, even in embodiments in which only a single MA-inducing oxide region (e.g., the intermediate oxide region 130) is included, the MA strength may be greater, due to the presence of the precursor trap material 680 (or, rather, the enriched trap material 682) than the MA strength of the same structure without the precursor trap material 680 (or, rather, the enriched trap material 682).

While the free region 120 (e.g., FIG. 1) is described as being "formed from" the precursor magnetic material 720 (e.g., a CoFeB material) that comprises the diffusive species 621' (FIG. 7A), the free region 120 of the fabricated, magnetic cell core 101 (FIG. 1) (or any cell core of the present disclosure) may comprise substantially less of the diffusive species 621' (e.g., the boron (B)) than when the precursor magnetic material 720 was initially formed. Likewise, in embodiments in which magnetic material of the fixed region 110 (FIG. 1) is affected by a neighboring region of a trap material, the fixed region 110 may comprise substantially less of the diffusive species 621' than it would without the nearby trap material. Rather, the trap region 180 (FIG. 1) of the fabricated, magnetic cell core 101 may comprise both the species of the precursor trap material 680 and the diffused species 621 (e.g., the boron (B)), which has diffused from the precursor magnetic material 720.

With continued reference to FIGS. 7 and 8, an oxide material 730, from which the intermediate oxide region 130 (FIG. 1) is formed, may be formed on the precursor magnetic material 720, e.g., before the anneal that crystallizes the depleted magnetic material 820. The oxide material 730 may comprise, consist essentially of, or consist of, for example and without limitation, a nonmagnetic oxide material (e.g., magnesium oxide (MgO), aluminum oxide ($Al_2O_3$), titanium oxide ($TiO_2$), or other oxide materials of conventional MTJ nonmagnetic regions). In embodiments in which another oxide material was formed before the precursor trap material 680, the another oxide material may be the same material as the oxide material 730 or a material comprising the same elements as the oxide material 730 though with different atomic ratios thereof. For example, and without limitation, both of the oxide material 730 and another oxide material, in a dual-oxide embodiment, may comprise, consist essentially of, or consist of MgO.

The oxide material 730 may be formed (e.g., grown, deposited) directly on the precursor magnetic material 720. The oxide material 730 may be crystalline (e.g., with the bcc (001) structure) when initially formed or may later be crystallized during anneal. The oxide material 730 may be positioned such that, during anneal, the desired crystal structure may propagate to a neighboring magnetic material (e.g., the depleted magnetic material 820 (FIG. 8)) to enable the magnetic material (e.g., the depleted magnetic material 820 (FIG. 8)) to crystallize into the same crystal structure (e.g., the bcc (001) structure).

Other materials of the annealed intermediate structure 800 may also be crystallized due to annealing. The annealing process may be conducted at an annealing temperature of from about 300° C. to about 700° C. (e.g., about 500° C.) and may be held at the annealing temperature for from about one minute (about 1 min.) to about one hour (about 1 hr.). The annealing temperature and time may be tailored based on the materials of the intermediate structure 700, the desired crystal structure of, e.g., the depleted magnetic material 820, and a desired amount of depletion of the diffused species 621 from the precursor magnetic material 720.

In some embodiments, such as that illustrated in FIGS. 7 and 8, the another magnetic material 713, from which the oxide-adjacent portion 113 of the fixed region 110' (FIG. 1A) is formed, may be formed (e.g., grown, deposited) directly on the oxide material 730, e.g., before or after the anneal stage that crystallizes the depleted magnetic material 820. The another magnetic material 713 may comprise, consist essentially of, or consist of, for example and without limitation, ferromagnetic material including cobalt (Co) and iron (Fe) (e.g., $Co_xFe_y$, wherein x=10 to 80 and y=10 to 80) and, in some embodiments, also boron (B) (e.g., $Co_xFe_yB_z$, wherein x=10 to 80, y=10 to 80, and z=0 to 50). Thus, the another magnetic material 713 may comprise a CoFeB material. In some embodiments, the another magnetic material 713 may be the same material as either or both of precursor magnetic material 720 and the foundation material, if included in the intermediate structure 800, or a material having the same elements, though in different atomic ratios.

Figure 9A:
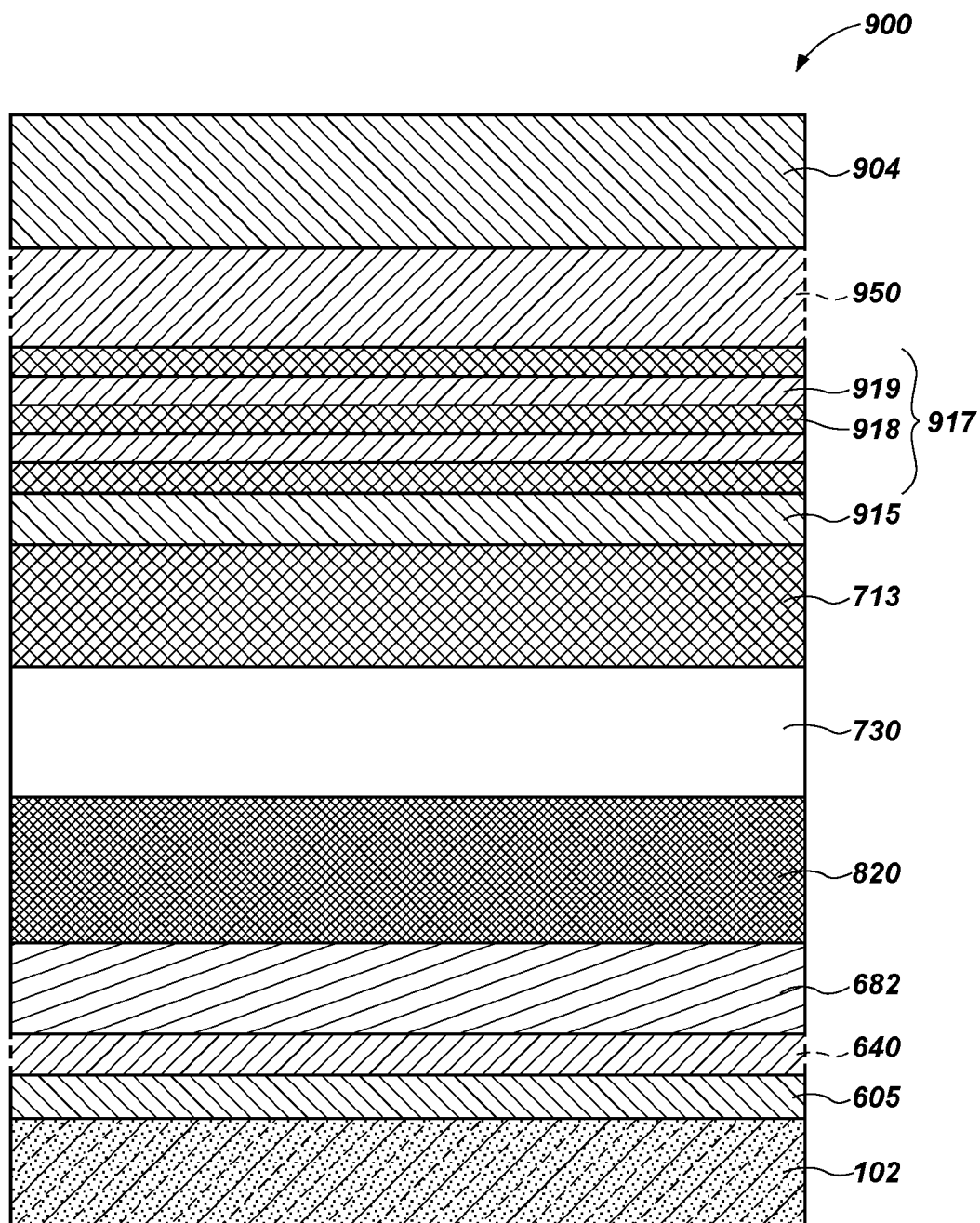
FIG. 9A is a cross-sectional, elevational, schematic illustration of a precursor structure during a stage of processing subsequent to that of FIG. 8, according to an embodiment of the present disclosure.

With reference to FIG. 9A, according to an embodiment to form the magnetic cell structure 100 according to FIGS. 1 and 1A, a non-trap, intermediate material 915 may be formed on the another magnetic material 713 after the annealed intermediate structure 800 (FIG. 8) has been formed. The intermediate material 915 may, therefore, comprise, consist essentially of, or consist of a conductive material (e.g., tantalum (Ta)).

Figure 9B:
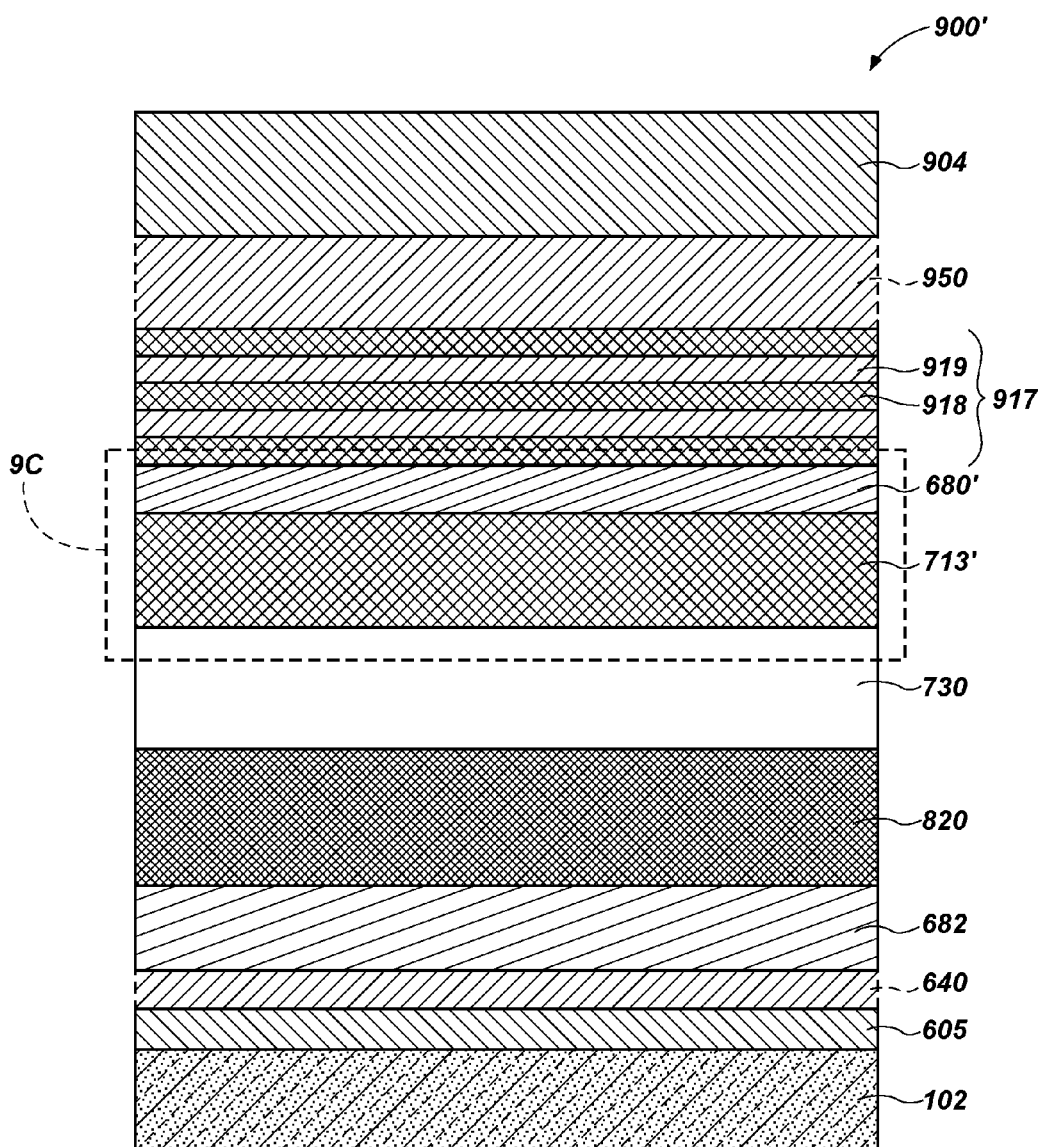
FIG. 9B is a cross-sectional, elevational, schematic illustration of a precursor structure during a stage of processing subsequent to that of FIG. 8, according to an alternate embodiment of the present disclosure.

Alternatively, with reference to FIG. 9B, according to an embodiment to form the magnetic cell structure 100 according to FIGS. 1 and 1B, another precursor trap material 680' may be formed instead of the intermediate material 915 of FIG. 9A. In such embodiments, the another magnetic material 713 may be characterized as another precursor magnetic material 713' that includes a diffusive species 621' (FIG. 7A) (e.g., boron (B)) that may be removed from the another precursor magnetic material 713' by the another precursor trap material 680'. The another precursor trap material 680' may be formed on the another precursor magnetic material 713' prior to annealing, such that an annealed structure segment 900" (FIG. 9C) may include another depleted magnetic material 820' (FIG. 9C) formed from the another precursor magnetic material 713'. The annealed structure segment 900" also includes another amorphous enriched trap material 682' proximate to the another depleted magnetic material 820'.

Figure 9C:
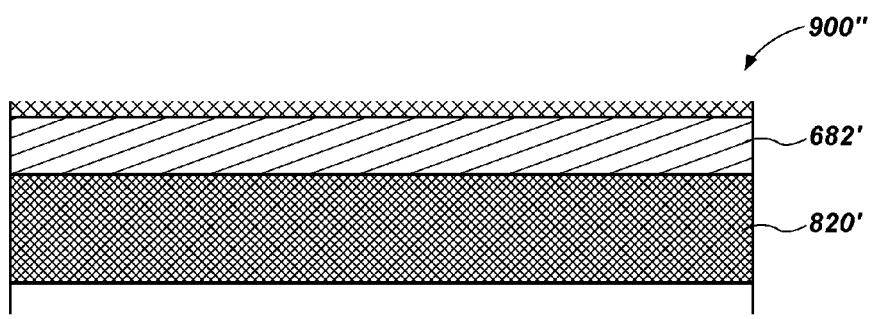

The remaining materials of the magnetic cell structure (e.g., the magnetic cell structure 100 (FIGS. 1, 1A, 1B)) may be fabricated over the intermediate material 915, according to the embodiment of FIG. 9A, or over the another enriched trap material 682', according to the embodiment of FIGS. 9B and 9C, to form a precursor structure 900 (FIG. 9A) or 900' (FIG. 9B), respectively. For example, materials 917, such as alternating magnetic material 918 and coupler material 919, may be formed on the intermediate material 915 (FIG. 9A) or on the another enriched trap material 682' (FIG. 9C). For example, and without limitation, the materials 917 may comprise, consist essentially of, or consist of cobalt/palladium (Co/Pd) multi-sub-regions; cobalt/platinum (Co/Pt) multi-sub-regions; cobalt/nickel (Co/Ni) multi-sub-regions; cobalt/iron/terbium (Co/Fe/Tb) based materials, $L_1 0$ materials, coupler materials, or other magnetic materials of conventional fixed regions. Thus, the fixed region 110' (FIG. 1A) or 110" (FIG. 1B), respectively, may include the electrode-adjacent portion 117 (FIGS. 1A and 1B) formed from the materials 917. The fixed region 110' (FIG. 1A) or 110" (FIG. 1B) may also include the intermediate portion 115 (FIG. 1A) or the another trap region 182 (FIG. 1B) formed from the intermediate material 915 or the another enriched trap material 682', respectively, and the oxide-adjacent portion 113 (FIG. 1A) or 114 (FIG. 1B) formed from the another precursor magnetic material 713 (FIG. 9A) or the another depleted magnetic material 820' (FIG. 9C), respectively.

In some embodiments, optionally, one or more upper intermediary materials 950 may be formed over the materials 917 for the electrode-adjacent portion 117 of the fixed region 110' (FIG. 1A), 110" (FIG. 1B). The upper intermediary materials 950, which, if included, form the optional upper intermediary regions 150 (FIG. 1), may comprise, consist essentially of, or consist of materials configured to ensure a desired crystal structure in neighboring materials. The upper intermediary materials 950 may alternatively or additionally include metal materials configured to aid in patterning processes during fabrication of the magnetic cell, barrier materials, or other materials of conventional STT-MRAM cell core structures. In some embodiments, the upper intermediary material 950 may include a conductive material (e.g., one or more materials such as copper, tantalum, titanium, tungsten, ruthenium, tantalum nitride, or titanium nitride) to be formed into a conductive capping region.

Another conductive material 904, from which the upper electrode 104 (FIG. 1) may be formed, may be formed over the materials 917 for the electrode-adjacent portion 117 of the fixed region 110' (FIG. 1A), 110" (FIG. 1B) and, if present, the upper intermediary materials 950. In some embodiments, the another conductive material 904 and the upper intermediary materials 950, if present, may be integrated with one another, e.g., with the upper intermediary materials 950 being lower sub-regions of the conductive material 904.

The precursor structure 900 (FIG. 9A), 900' (FIG. 9B) may then be patterned, in one or more stages, to form the magnetic cell structure 100, according to the embodiment illustrated in FIGS. 1 and 1A or in FIGS. 1 and 1B, respectively. Techniques for patterning structures such as the precursor structure 900 (FIG. 9A), 900' (FIG. 9B) to form structures such as the magnetic cell structure 100 (FIGS. 1, 1A, and 1B) are known in the art and so are not described herein in detail.

After patterning, the magnetic cell structure 100 includes the magnetic cell core 101 including the trap region 180 proximate to the free region 120 and, in the embodiment of FIG. 1B, the another trap region 182 proximate to the fixed region 110". The free region 120 includes the depleted magnetic material 820 (FIG. 8), formed from the precursor magnetic material 720 (FIG. 7) and comprises a lower concentration of the diffusive species 621' (FIG. 7A) than a free region formed from the precursor magnetic material 720 (FIG. 7) without the trap region 180 proximate thereto. Moreover, according to the embodiment of FIG. 1B, the fixed region 110", including the another depleted magnetic material 820' (FIG. 9C) in the oxide-adjacent portion 114 formed from the another precursor magnetic material 713' (FIG. 9B), comprises a lower concentration of the diffusive species 621' (FIG. 7A) than a fixed region formed from the another precursor magnetic material 713' (FIG. 9B) without the another trap region 182 proximate thereto.

In some embodiments, the magnetic region or regions (e.g., the free region 120, the fixed region 110" (FIG. 1B)) proximate to the trap region or regions (e.g., the trap region 180, the another trap region 182 (FIG. 1B)) may be substantially or completely depleted of the diffusive species 621'. In other embodiments, the magnetic region or regions may be partially depleted of the diffusive species 621'. In such embodiments, the magnetic region or regions may have a gradient of the diffusive species 621' (e.g., boron) therethrough, with a low concentration of the diffusive species 621' adjacent to the trap region 180 and a high concentration of the diffusive species 621' opposite the trap region 180, relative to one another. The concentration of the diffusive species 621' may, in some embodiments, equilibrate after or during anneal.

The free region 120, or other magnetic region (e.g., the oxide-adjacent portion 114 of the fixed region 110" (FIG. 1B)), formed with a crystalline, depleted magnetic material 820 (FIG. 8), or other depleted magnetic material, may have a desired crystal structure that may be substantially free of defects, due, at least in part, to the removal of the diffusive species 621' and the bonding of the diffused species 621 to what were the trap sites 687 (FIG. 6D) and due, at least in part, to the amorphous microstructure of the trap region 180 (or the another trap region 182).

The crystallinity of the free region 120 may enable the magnetic cell structure 100 to exhibit a high TMR during use and operation. Furthermore, the depleted magnetic material 820 of the free region 120 may promote MA-inducement with a neighboring oxide region (e.g., the secondary oxide region 270 and the intermediate oxide region 130).

Moreover, in embodiments in which the free region 120 is disposed between dual oxide regions (e.g., the intermediate oxide region 130 and the secondary oxide region 270 of FIG. 2), high MA strength may be further promoted due to MA-inducement from both of the dual oxide regions. In such embodiments, MA may be induced along the surface of the free region 120 proximate to the secondary oxide region 270, even with the trap region 180 disposed between the free region 120 and the secondary oxide region 270. The amount of precursor trap material 680 (FIG. 7) used to form the trap region 180 may be tailored to be of an amount sufficient to effect removal of at least some of the diffusive species 621' (FIG. 7A) from the precursor magnetic material 720 (FIG.

7A) while also being an amount not so substantial as to inhibit MA inducement between the secondary oxide region 270 and the free region 120.

Accordingly, disclosed is a method of forming a magnetic memory cell. The method comprises forming a precursor structure. Forming the precursor structure comprises forming a precursor trap material comprising trap sites over a substrate. Forming the precursor structure also comprises forming a precursor magnetic material comprising a diffusive species adjacent to the precursor trap material. The diffusive species is transferred from the precursor magnetic material to the precursor trap material to convert at least a portion of the precursor magnetic material into a depleted magnetic material and to convert at least a portion of the precursor trap material into an enriched trap material. After the transferring, a magnetic cell core structure is formed from the precursor structure.

Magnetic cell structure 400 of FIG. 4A includes the magnetic cell core 401 that may be characterized as an inversion of the magnetic cell core 101 of FIGS. 1 and 1A. The magnetic cell structure 400 of FIG. 4A may be fabricated by forming and patterning the materials of the magnetic cell structure 400 from the substrate 102 upwards, with at least one anneal subsequent to forming the precursor trap material 680 (FIG. 6) for the trap region 480 overlying the free region 420.

Magnetic cell structure 400' of FIG. 4B includes the magnetic cell core 401' that may be characterized as an inversion of the magnetic cell core 101 of FIGS. 1 and 1B. The magnetic cell structure 400' of FIG. 4B may be fabricated by forming and patterning the materials of the magnetic cell structure 400' from the substrate 102 upwards, with at least one anneal subsequent to forming the precursor trap material 680 (FIG. 6) for the trap region 480 overlying the free region 420. Optionally, an intermediate anneal may be performed after forming the another precursor magnetic material 713' (FIG. 9B) for the oxide-adjacent portion 414 of the fixed region 410'.

The magnetic cell structure 500 of FIG. 5 includes the magnetic cell core 501 that may be characterized as an inversion of the magnetic cell core 201 of FIG. 2. The magnetic cell structure 500 of FIG. 5 may be fabricated by forming and patterning the materials of the magnetic cell structure 500 from the substrate 102 upwards, with at least one anneal subsequent to forming the precursor trap material 680 (FIG. 6) for the trap region 480. Optionally, an intermediate anneal may be performed after forming the another precursor magnetic material 713' (FIG. 9B) of the oxide-adjacent portion 414 of the fixed region 410'.

Accordingly disclosed is a method of forming a semiconductor structure. The method comprises forming an amorphous precursor magnetic material comprising at least one diffusive species over a substrate. A precursor trap material comprising an attracter species having at least one trap site is formed proximate the amorphous precursor magnetic material. The amorphous precursor magnetic material and the precursor trap material are annealed to react the diffusive species with the at least one trap site of the attracter species.

Figure 10:
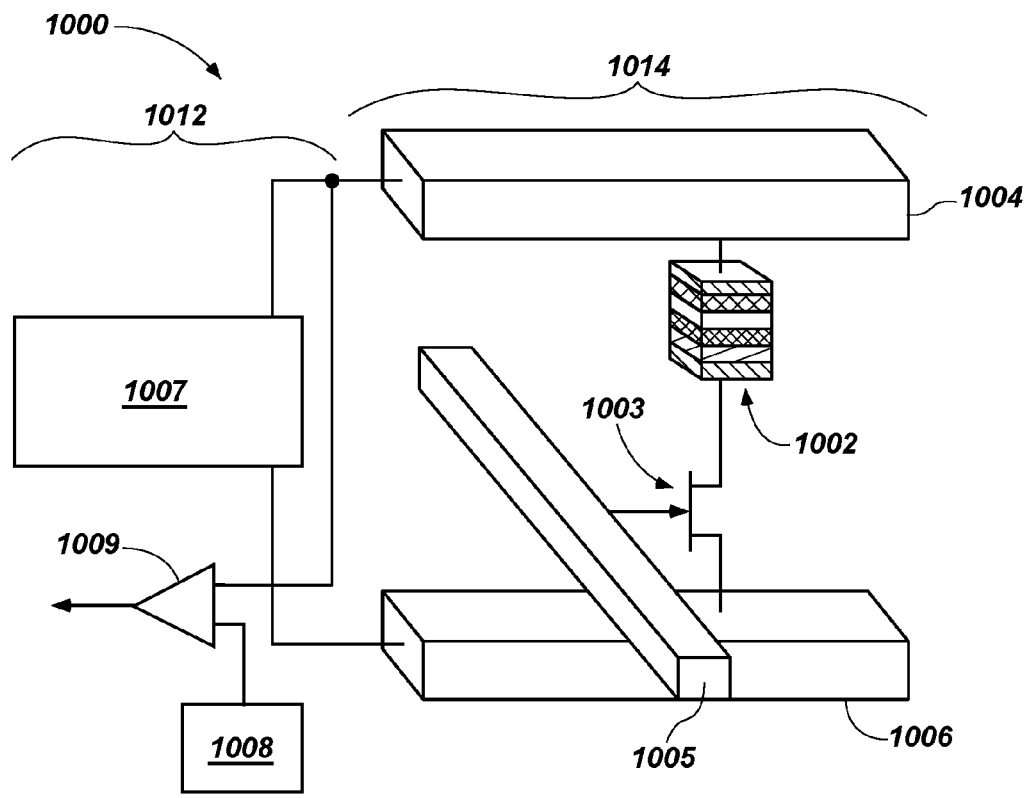
FIG. 10 is a schematic diagram of an STT-MRAM system including a memory cell having a magnetic cell structure according to an embodiment of the present disclosure.

With reference to FIG. 10, illustrated is an STT-MRAM system 1000 that includes peripheral devices 1012 in operable communication with an STT-MRAM cell 1014, a grouping of which may be fabricated to form an array of memory cells in a grid pattern including a number of rows and columns, or in various other arrangements, depending on the system requirements and fabrication technology. The STT-MRAM cell 1014 includes a magnetic cell core 1002, an access transistor 1003, a conductive material that may function as a data/sense line 1004 (e.g., a bit line), a conductive material that may function as an access line 1005 (e.g., a word line), and a conductive material that may function as a source line 1006. The peripheral devices 1012 of the STT-MRAM system 1000 may include read/write circuitry 1007, a bit line reference 1008, and a sense amplifier 1009. The cell core 1002 may be any one of the magnetic cell cores (e.g., the magnetic cell cores 101 (FIG. 1), 201 (FIG. 2), 401 (FIG. 4A), 401' (FIG. 4B), 501 (FIG. 5)) described above. Due to the structure of the cell core 1002, the method of fabrication, or both, the STT-MRAM cell 1014 may have a high TMR and a high MA strength.

In use and operation, when an STT-MRAM cell 1014 is selected to be programmed, a programming current is applied to the STT-MRAM cell 1014, and the current is spin-polarized by the fixed region of the cell core 1002 and exerts a torque on the free region of the cell core 1002, which switches the magnetization of the free region to "write to" or "program" the STT-MRAM cell 1014. In a read operation of the STT-MRAM cell 1014, a current is used to detect the resistance state of the cell core 1002.

To initiate programming of the STT-MRAM cell 1014, the read/write circuitry 1007 may generate a write current (i.e., a programming current) to the data/sense line 1004 and the source line 1006. The polarity of the voltage between the data/sense line 1004 and the source line 1006 determines the switch in magnetic orientation of the free region in the cell core 1002. By changing the magnetic orientation of the free region with the spin polarity, the free region is magnetized according to the spin polarity of the programming current, the programmed logic state is written to the STT-MRAM cell 1014.

To read the STT-MRAM cell 1014, the read/write circuitry 1007 generates a read voltage to the data/sense line 1004 and the source line 1006 through the cell core 1002 and the access transistor 1003. The programmed state of the STT-MRAM cell 1014 relates to the electrical resistance across the cell core 1002, which may be determined by the voltage difference between the data/sense line 1004 and the source line 1006. In some embodiments, the voltage difference may be compared to the bit line reference 1008 and amplified by the sense amplifier 1009.

FIG. 10 illustrates one example of an operable STT-MRAM system 1000. It is contemplated, however, that the magnetic cell cores 101 (FIG. 1), 201 (FIG. 2), 401 (FIG. 4A), 401' (FIG. 4B), 501 (FIG. 5) may be incorporated and utilized within any STT-MRAM system configured to incorporate a magnetic cell core having magnetic regions.

Accordingly, disclosed is a semiconductor device comprising a spin torque transfer magnetic random memory (STT-MRAM) array comprising STT-MRAM cells. At least one STT-MRAM cell of the STT-MRAM cells comprises a crystalline magnetic region over a substrate. The crystalline magnetic region exhibits a switchable magnetic orientation. A crystalline oxide region is adjacent the crystalline magnetic region. A magnetic region, exhibiting a substantially fixed magnetic orientation, is spaced from the crystalline magnetic region by the crystalline oxide region. An amorphous trap region is adjacent the crystalline magnetic region. The amorphous trap region comprises a species diffused from a precursor magnetic material of the crystalline magnetic region and bonded to an attracter species of a precursor trap material of the amorphous trap region. The precursor magnetic material had trap sites at which the species, diffused from the precursor magnetic material, is bonded to the attracter species in the amorphous trap region.

Figure 11:
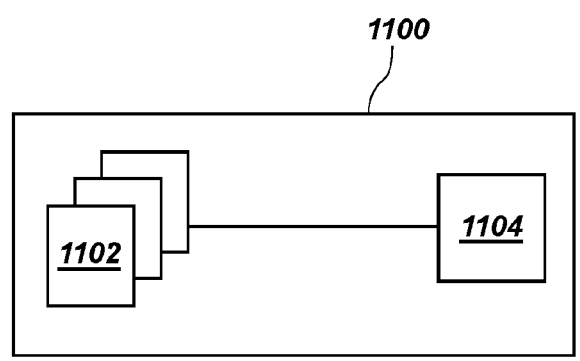
FIG. 11 is a simplified block diagram of a semiconductor device structure including memory cells having a magnetic cell structure according to an embodiment of the present disclosure.

With reference to FIG. 11, illustrated is a simplified block diagram of a semiconductor device 1100 implemented according to one or more embodiments described herein. The semiconductor device 1100 includes a memory array 1102 and a control logic component 1104. The memory array 1102 may include a plurality of the STT-MRAM cells 1014 (FIG. 10) including any of the magnetic cell cores 101 (FIG. 1), 201 (FIG. 2), 401 (FIG. 4A), 401' (FIG. 4B), 501 (FIG. 5) discussed above, which magnetic cell cores 101 (FIG. 1), 201 (FIG. 2), 401 (FIG. 4A), 401' (FIG. 4B), 501 (FIG. 5) may have been formed according to a method described above and may be operated according to a method described above. The control logic component 1104 may be configured to operatively interact with the memory array 1102 so as to read from or write to any or all memory cells (e.g., STT-MRAM cell 1014 (FIG. 10)) within the memory array 1102.

Figure 12:
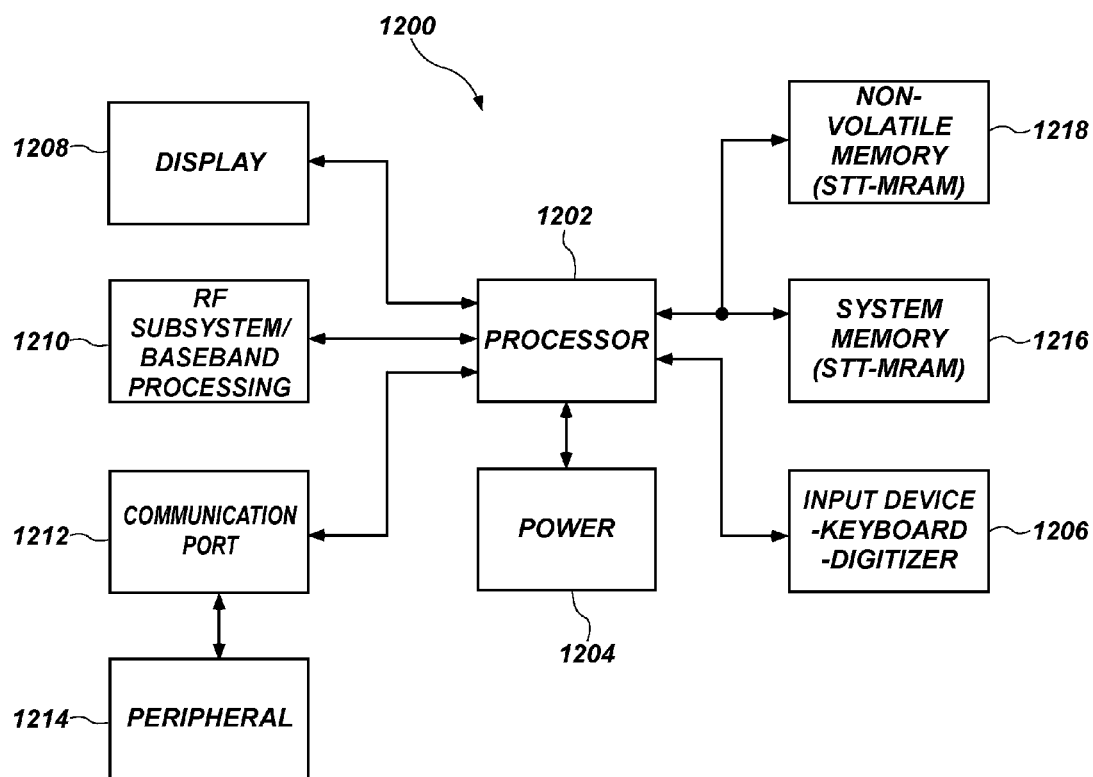
FIG. 12 is a simplified block diagram of a system implemented according to one or more embodiments of the present disclosure.

With reference to FIG. 12, depicted is a processor-based system 1200. The processor-based system 1200 may include various electronic devices manufactured in accordance with embodiments of the present disclosure. The processor-based system 1200 may be any of a variety of types such as a computer, pager, cellular phone, personal organizer, control circuit, or other electronic device. The processor-based system 1200 may include one or more processors 1202, such as a microprocessor, to control the processing of system functions and requests in the processor-based system 1200. The processor 1202 and other subcomponents of the processor-based system 1200 may include magnetic memory devices manufactured in accordance with embodiments of the present disclosure.

The processor-based system 1200 may include a power supply 1204 in operable communication with the processor 1202. For example, if the processor-based system 1200 is a portable system, the power supply 1204 may include one or more of a fuel cell, a power scavenging device, permanent batteries, replaceable batteries, and rechargeable batteries. The power supply 1204 may also include an AC adapter; therefore, the processor-based system 1200 may be plugged into a wall outlet, for example. The power supply 1204 may also include a DC adapter such that the processor-based system 1200 may be plugged into a vehicle cigarette lighter or a vehicle power port, for example.

Various other devices may be coupled to the processor 1202 depending on the functions that the processor-based system 1200 performs. For example, a user interface 1206 may be coupled to the processor 1202. The user interface 1206 may include input devices such as buttons, switches, a keyboard, a light pen, a mouse, a digitizer and stylus, a touch screen, a voice recognition system, a microphone, or a combination thereof. A display 1208 may also be coupled to the processor 1202. The display 1208 may include an LCD display, an SED display, a CRT display, a DLP display, a plasma display, an OLED display, an LED display, a three-dimensional projection, an audio display, or a combination thereof. Furthermore, an RF sub-system/baseband processor 1210 may also be coupled to the processor 1202. The RF sub-system/baseband processor 1210 may include an antenna that is coupled to an RF receiver and to an RF transmitter (not shown). A communication port 1212, or more than one communication port 1212, may also be coupled to the processor 1202. The communication port 1212 may be adapted to be coupled to one or more peripheral devices 1214, such as a modem, a printer, a computer, a scanner, or a camera, or to a network, such as a local area network, remote area network, intranet, or the Internet, for example.

The processor 1202 may control the processor-based system 1200 by implementing software programs stored in the memory. The software programs may include an operating system, database software, drafting software, word processing software, media editing software, or media playing software, for example. The memory is operably coupled to the processor 1202 to store and facilitate execution of various programs. For example, the processor 1202 may be coupled to system memory 1216, which may include one or more of spin torque transfer magnetic random access memory (STT-MRAM), magnetic random access memory (MRAM), dynamic random access memory (DRAM), static random access memory (SRAM), racetrack memory, and other known memory types. The system memory 1216 may include volatile memory, non-volatile memory, or a combination thereof. The system memory 1216 is typically large so that it can store dynamically loaded applications and data. In some embodiments, the system memory 1216 may include semiconductor devices, such as the semiconductor device 1100 of FIG. 11, memory cells including any of the magnetic cell cores 101 (FIG. 1), 201 (FIG. 2), 401 (FIG. 4A), 401' (FIG. 4B), 501 (FIG. 5) described above, or a combination thereof.

The processor 1202 may also be coupled to non-volatile memory 1218, which is not to suggest that system memory 1216 is necessarily volatile. The non-volatile memory 1218 may include one or more of STT-MRAM, MRAM, read-only memory (ROM) such as an EPROM, resistive read-only memory (RROM), and flash memory to be used in conjunction with the system memory 1216. The size of the non-volatile memory 1218 is typically selected to be just large enough to store any necessary operating system, application programs, and fixed data. Additionally, the non-volatile memory 1218 may include a high-capacity memory such as disk drive memory, such as a hybrid-drive including resistive memory or other types of non-volatile solid-state memory, for example. The non-volatile memory 1218 may include semiconductor devices, such as the semiconductor device 1100 of FIG. 11, memory cells including any of the magnetic cell cores 101 (FIG. 1), 201 (FIG. 2), 401 (FIG. 4A), 401' (FIG. 4B), 501 (FIG. 5) described above, or a combination thereof.

While the present disclosure is susceptible to various modifications and alternative forms in implementation thereof, specific embodiments have been shown by way of example in the drawings and have been described in detail herein. However, the present disclosure is not intended to be limited to the particular forms disclosed. Rather, the present disclosure encompasses all modifications, combinations, equivalents, variations, and alternatives falling within the scope of the present disclosure as defined by the following appended claims and their legal equivalents.

What is claimed is:

1. A semiconductor device, comprising:
    a magnetic region over a substrate, the magnetic region formed from a precursor magnetic material comprising a diffusive species, the precursor magnetic material comprising cobalt (Co) and iron (Fe) and the diffusive species boron (B);
    an intermediate oxide region between the magnetic region and another magnetic region; and
    a trap region directly adjacent the magnetic region and spaced from the intermediate oxide region and comprising at least one attracter species comprising at least one trap site, the at least one attracter species formulated to exhibit a higher chemical affinity for the diffusive species of the precursor magnetic material than a chemical affinity between the diffusive species and another species of the precursor magnetic material, the at least one attracter species comprising:
cobalt (Co), iron (Fe), and at least 35 at. % tungsten (W); or
ruthenium (Ru) and tungsten (W).

2. The semiconductor device of claim 1, wherein the precursor magnetic material is amorphous.

3. The semiconductor device of claim 1, wherein the trap region comprises sub-regions of the at least one attracter species, wherein sub-regions of an attracter species of the at least one attracter species alternate with sub-regions of another attracter species of the at least one attracter species.

4. The semiconductor device of claim 3, wherein at least one interface between the sub-regions of the attracter species and the sub-regions of the another attracter species comprises the at least one trap site.

5. The semiconductor device of claim 1, further comprising a magnetic memory cell comprising a magnetic cell core comprising the magnetic region, the intermediate oxide region, the another magnetic region, and the trap region.

6. A method of forming a magnetic memory cell, comprising:
forming a precursor structure, comprising:
forming a precursor trap material over a substrate, the precursor trap material comprising at least one attracter species comprising at least one trap site, the at least one attracter species comprising:
cobalt (Co), iron (Fe), and at least 35 at. % tungsten (W); or
ruthenium (Ru) and tungsten (W);
forming a precursor magnetic material comprising cobalt (Co) and iron (Fe) a boron (B) diffusive species directly adjacent to the precursor trap material, the at least one attracter species of the precursor trap material formulated to exhibit a higher chemical affinity for the boron diffusive species of the precursor magnetic material than a chemical affinity between the boron diffusive species and another species of the precursor magnetic material;
forming an oxide material adjacent to the precursor magnetic material;
forming another magnetic material adjacent to the oxide material; and
transferring the boron diffusive species from the precursor magnetic material to the precursor trap material to convert at least a portion of the precursor magnetic material into a depleted magnetic material and to convert at least a portion of the precursor trap material into an enriched trap material; and
after the transferring, forming a magnetic cell core structure from the precursor structure, the magnetic cell core structure comprising:
a magnetic region over the substrate, the magnetic region formed from the precursor magnetic material;
another magnetic region formed from the another magnetic material;
an intermediate oxide region formed from the oxide material and disposed between the magnetic region and the another magnetic region; and
a trap region formed from the enriched trap material, the trap region disposed directly adjacent the magnetic region and spaced from the intermediate oxide region, the trap region comprising the at least one attracter species.

7. The method of claim 6, wherein:
forming a precursor trap material over a substrate comprises forming a material structure comprising sub-regions of an attracter species of the at least one attracter species alternating with sub-regions of at least one other attracter species of the at least one attracter species, the material structure comprising the at least one trap site of the at least one attracter species, the at least one trap site disposed at least along interfaces between the sub-regions of the attracter species and the sub-regions of the at least one other attracter species; and
transferring the boron diffusive species from the precursor magnetic material to the precursor trap material comprises reacting the boron diffusive species with the at least one trap site of the at least one attracter species.

8. The method of claim 7, further comprising bombarding the material structure to disrupt attached bonds of the material structure and form additional trap sites of the at least one trap site.

9. The method of claim 6, wherein:
forming a precursor trap material over a substrate comprises:
forming the at least one attracter species over the substrate; and
bombarding the at least one attracter species to disrupt attached bonds of the at least one attracter species and form the at least one trap site; and
transferring the boron diffusive species from the precursor magnetic material to the precursor trap material comprises diffusing the boron diffusive species into the precursor trap material and reacting the boron diffusive species at the at least one trap site.

10. The method of claim 6, wherein:
forming a precursor trap material over a substrate comprises forming the precursor trap material over a conductive material on the substrate; and
forming a precursor magnetic material adjacent to the precursor trap material comprises forming the precursor magnetic material over the precursor trap material.

11. The method of claim 10, wherein forming an oxide material adjacent to the precursor magnetic material comprises forming the oxide material over the precursor magnetic material.

12. The method of claim 11, wherein forming another magnetic material adjacent to the oxide material comprises forming the another magnetic material over the oxide material.

13. The method of claim 6, wherein transferring the boron diffusive species from the precursor magnetic material to the precursor trap material comprises converting at least the portion of the precursor trap material into the enriched trap material, the enriched trap material exhibiting an amorphous microstructure.

14. A method of forming a semiconductor structure, comprising:
forming an amorphous precursor magnetic material comprising at least one diffusive species over a substrate, the amorphous precursor magnetic material comprising cobalt (Co), iron (Fe), and the at least one diffusive species comprising boron (B);
forming a precursor trap material directly adjacent the amorphous precursor magnetic material, the precursor trap material comprising at least one attracter species comprising at least one trap site, the at least one attracter species formulated to exhibit a higher chemical affinity for the diffusive species of the amorphous precursor magnetic material than a chemical affinity between the diffusive species and another species of the amorphous precursor magnetic material, the at least one attracter species comprising:
  cobalt (Co), iron (Fe), and at least 35 at. % tungsten (W); or
  ruthenium (Ru) and tungsten (W);
forming an oxide material proximate the amorphous precursor magnetic material;
forming another magnetic material proximate the oxide material;
annealing the amorphous precursor magnetic material and the precursor trap material to react the diffusive species at the at least one trap site of the at least one attracter species, to form an enriched trap material from the precursor trap material, and to form a depleted magnetic material from the precursor magnetic material; and
patterning the depleted magnetic material, the enriched trap material, the oxide material, and the another magnetic material to form the semiconductor structure, the semiconductor structure comprising:
  a magnetic region over the substrate, the magnetic region formed from the depleted magnetic material formed from the amorphous precursor magnetic material;
  another magnetic region formed from the another magnetic material;
  an intermediate oxide region formed from the oxide material, the intermediate oxide region disposed between the magnetic region and the another magnetic region; and
  a trap region formed from the enriched trap material, the trap region disposed directly adjacent the magnetic region and spaced from the intermediate oxide region, the trap region comprising the at least one attracter species.

15. The method of claim 14, wherein annealing comprises annealing at a temperature of greater than 500° C.

16. The method of claim 14, wherein forming a precursor trap material proximate the amorphous precursor magnetic material comprises forming alternating sub-regions of a plurality of the at least one attracter species.

17. The method of claim 14, wherein annealing the amorphous precursor magnetic material and the precursor trap material comprises converting a microstructure of the precursor trap material from a crystalline microstructure to an amorphous microstructure.

18. A semiconductor device, comprising:
  a spin torque transfer magnetic random access memory (STT-MRAM) array comprising:
    STT-MRAM cells, at least one STT-MRAM cell of the STT-MRAM cells comprising:
      a crystalline magnetic region over a substrate, the crystalline magnetic region exhibiting a switchable magnetic orientation and comprising cobalt (Co) and iron (Fe);
      a crystalline oxide region adjacent the crystalline magnetic region;
      a magnetic region exhibiting a substantially fixed magnetic orientation and spaced from the crystalline magnetic region by the crystalline oxide region; and
      an amorphous trap region directly adjacent the crystalline magnetic region, the amorphous trap region comprising boron diffused from a precursor magnetic material of the crystalline magnetic region and bonded to an attracter species of a precursor trap material of the amorphous trap region, the precursor trap material having trap sites at which the species diffused from the precursor magnetic material is bonded to the attracter species in the amorphous trap region, the amorphous trap region comprising the boron and the precursor trap material, the precursor trap material comprising:
        cobalt (Co), iron (Fe), and at least 35 at. % tungsten (W), or
        ruthenium (Ru) and tungsten (W).

19. The semiconductor device of claim 18, wherein the crystalline magnetic region and the crystalline oxide region exhibit a bcc (001) crystal structure.

* * * * *